(12) United States Patent
Terada et al.

(10) Patent No.: US 7,576,965 B2
(45) Date of Patent: Aug. 18, 2009

(54) SURGE ABSORPTION ELEMENT AND SURGE ABSORPTION CIRCUIT

(75) Inventors: Yuji Terada, Tokyo (JP); Dai Matsuoka, Tokyo (JP); Naoki Chida, Tokyo (JP)

(73) Assignee: TDK Corporation, Tokyo (JP)

( * ) Notice: Subject to any disclaimer, the term of this patent is extended or adjusted under 35 U.S.C. 154(b) by 133 days.

(21) Appl. No.: 11/487,425

(22) Filed: Jul. 17, 2006

(65) Prior Publication Data

US 2007/0025043 A1   Feb. 1, 2007

(30) Foreign Application Priority Data

Jul. 29, 2005   (JP)   ............................. 2005-221665

(51) Int. Cl.
*H01C 7/12* (2006.01)

(52) U.S. Cl. ........................................ 361/118; 361/119
(58) Field of Classification Search ................. 361/118, 361/119

See application file for complete search history.

(56) References Cited

U.S. PATENT DOCUMENTS

| | | | |
|---|---|---|---|
| 3,340,458 A | 9/1967 | Keller | |
| 4,554,608 A | 11/1985 | Block | |
| 4,870,534 A | 9/1989 | Harford | |
| 5,124,873 A | 6/1992 | Wheeler et al. | |
| 5,668,511 A * | 9/1997 | Furutani et al. | ............. 333/204 |
| 5,966,283 A | 10/1999 | Glaser et al. | |
| 6,137,352 A | 10/2000 | Germann | |
| 6,236,551 B1 | 5/2001 | Jones et al. | |
| 6,384,705 B1 * | 5/2002 | Huang et al. | ................. 336/200 |
| 6,785,110 B2 | 8/2004 | Bartel et al. | |
| 6,937,115 B2 | 8/2005 | Perreault et al. | |
| 7,085,118 B2 | 8/2006 | Inoue et al. | |
| 7,221,550 B2 | 5/2007 | Chang et al. | |
| 2004/0145849 A1 | 7/2004 | Chang et al. | |
| 2004/0264087 A1 | 12/2004 | Bishop | |
| 2006/0038635 A1 * | 2/2006 | Richiuso et al. | ............. 333/177 |

FOREIGN PATENT DOCUMENTS

| | | |
|---|---|---|
| AU | 736010 | 5/1998 |
| EP | 0 840 413 A1 | 5/1998 |
| EP | 1 303 004 A2 | 4/2003 |
| GB | 2 302 621 A | 1/1997 |
| JP | A-55-060318 | 5/1980 |

(Continued)

*Primary Examiner*—Danny Nguyen
*Assistant Examiner*—Tien Mai
(74) *Attorney, Agent, or Firm*—Oliff & Berridge, PLC

(57) ABSTRACT

An object of the present invention is to provide a small surge absorption element that exhibits superior impedance matching even for high-speed signals and a surge absorption circuit. The surge absorption element comprises first and second inductor sections and first and second surge absorption sections. The first inductor section comprises first and second coils and the second inductor section comprises third and fourth coils. By suitably setting the coupling coefficients between the respective coils and the induction coefficients of the first to fourth coils, image impedance with an even frequency characteristic can be implemented over a wide area. Further, because the first to fourth coils have a positive magnetically coupled state with respect to one another, the induction coefficients of the first to fourth coils can be reduced in comparison with a case where the first to fourth coils are not afforded a positive magnetically coupled state.

19 Claims, 14 Drawing Sheets

FOREIGN PATENT DOCUMENTS

| | | |
|---|---|---|
| JP | U-58-100434 | 7/1983 |
| JP | U-58-173924 | 11/1983 |
| JP | A-61-125103 | 6/1986 |
| JP | A-61-189601 | 8/1986 |
| JP | U-62-002202 | 1/1987 |
| JP | A-62-108509 | 5/1987 |
| JP | A-63-039207 | 2/1988 |
| JP | U-3-20408 | 2/1991 |
| JP | A-3-140006 | 6/1991 |
| JP | A-03-274815 * | 12/1991 |
| JP | A-04-129312 | 4/1992 |
| JP | A-4-167508 | 6/1992 |
| JP | A-4-257112 | 9/1992 |
| JP | A-8-250309 | 9/1996 |
| JP | A-10-42450 | 2/1998 |
| JP | A-10-304561 | 11/1998 |
| JP | A-10-335115 | 12/1998 |
| JP | A-11-243006 | 9/1999 |
| JP | A-2000-228255 | 8/2000 |
| JP | A-2001-060838 | 3/2001 |
| JP | A-2001-160125 | 6/2001 |
| JP | A-2001-160728 | 6/2001 |
| JP | A-2003-168944 | 6/2003 |
| JP | A-2004-311877 | 11/2004 |
| JP | A-2005-505188 | 2/2005 |
| JP | A-2005-064779 | 3/2005 |
| JP | A-2005-136736 | 5/2005 |
| KR | 10-0470115 B1 | 1/2005 |
| KR | 10-0470116 B1 | 1/2005 |
| KR | 10-2005-0014904 A | 2/2005 |
| WO | WO 03/103091 A2 | 12/2003 |

* cited by examiner

SURGE ABSORPTION ELEMENT AND SURGE ABSORPTION CIRCUIT

BACKGROUND OF THE INVENTION

1. Field of the Invention

The present invention relates to a surge absorption element and a surge absorption circuit.

2. Description of the Related Art

A semiconductor device such as an IC or LSI is damaged by high-voltage static electricity or the characteristic of the semiconductor device deteriorates. Hence, a surge absorption element such as a varistor is used for the semiconductor device as static electricity countermeasure.

Further, surge absorption elements including varistors have a stray capacitance component or a stray inductance component. Hence, when a surge absorption element is applied to a circuit carrying a high-speed signal, the high-speed signal is made to deteriorate. If the stray capacitance component of a surge absorption element must be made small in order to apply the surge absorption element to a circuit carrying a high-speed signal, degradation of the leading edge characteristic and delay characteristic of the high-speed signal is unavoidable. However, when the stray capacitance component of the surge absorption element is small, the rise in the control voltage of the surge absorption element and the energy resistance must be reduced.

A surge absorption element that comprises an inductor and two varistors as surge absorption elements that alleviate the effects of the stray capacitance component is known (See Japanese Patent Application Laid Open No. 2001-60838, for example). The surge absorption element that appears in Japanese Patent Application Laid Open No. 2001-60838 comprises a parallel circuit comprising a first varistor and an inductor, a second varistor that is electrically serially connected to the parallel circuit, and an I/O electrode and grounding electrode that are connected to the two ends of the serial circuit of the second varistor and parallel circuit.

However, because, in the case of the surge absorption element appearing in Japanese Patent Application Laid Open No. 2001-60838, a bandpass filter is constituted by the stray capacitance of a first varistor, and an inductor, impedance matching is difficult to achieve over a wide bandwidth. Therefore, an adequate characteristic cannot be implemented for a high-speed signal. Further, not only is impedance matching with respect to a high-speed signal preferable but also miniaturization of the element itself is desirable.

SUMMARY OF THE INVENTION

An object of the present invention is to provide a small surge absorption element that exhibits superior impedance matching even for high-speed signals and a surge absorption circuit.

The surge absorption element according to a first invention comprises (A) an inductor section that comprises a first coil one end of which is connected to a first input terminal; a second coil one end of which is connected to a first output terminal and the other end of which is connected to the other end of the first coil; a third coil one end of which is connected to a second input terminal; and a fourth coil one end of which is connected to a second output terminal and the other end of which is connected to the other end of the third coil; (B) a first surge absorption section that comprises a first internal electrode that is connected to a first interconnect between the first coil and the second coil of the inductor section; a second internal electrode that faces the first internal electrode and is connected to a reference terminal; and a first surge absorption layer that is interposed between the first internal electrode and the second internal electrode; and (C) a second surge absorption section that comprises a third internal electrode that is connected to a second interconnect between the third coil and the fourth coil of the inductor section; a fourth internal electrode that faces the third internal electrode and is connected to the reference terminal; and a second surge absorption layer that is interposed between the third internal electrode and fourth internal electrode, (D) wherein the surge absorption element is constituted such that, when opposite-phase signals are applied to the first and second input terminals, the first, second, third, and fourth coils are afforded a positive magnetically coupled state with respect to one another.

Opposite-phase signals are input to the first and second input terminals.

Suppose that the section to which the first input terminal in the inductor section belongs is the first inductor section and the section to which the second input terminal belongs is the second inductor section. When a signal is input to the first input terminal of the first inductor section, the clamp voltage of the first surge absorption section is normally set higher than the voltage of the signal thus input. Hence, the first surge absorption section may be regarded as a high resistance and, as a result, a signal is transmitted to the first output terminal via the first and second coils.

When a surge is contained in the signal that is input to the first input terminal, the high voltage of the surge exceeds the clamp voltage of the first surge absorption section and is therefore clamped at the reference terminal. In order to absorb the surge more reliably, the clamping voltage may be lowered. However, the stray capacitance of the surge absorption section increases in inverse proportion to the drop in the clamp voltage. The stray capacitance affects the transmission of the high-speed signal and therefore an increase of the stray capacitance is undesirable.

Further, the first coil, the first surge absorption section having the capacitance component, and the second coil constitute a T-type lowpass filter. The image impedance of the lowpass filter is fixed by the signal transmission bandwidth but fluctuates greatly at or above the blocked frequencies. The blocked frequencies are decided by the LC constant and a high-order, harmonic component contained in the high-speed signal is reflected as a result of an impedance mismatch, whereby the pulse waveform is alleviated or is the cause of unnecessary radiation. As a result, the reflection of the high-speed signal due to the LC constant is undesirable. In order to transmit a high frequency signal without causing same to be reflected, the impedance-matched frequency bandwidth is preferably widened.

Meanwhile, a signal the phase of which is the opposite of the phase of the input signal input to the first input terminal is input to the second input terminal of the second inductor section and the second inductor section and second surge absorption section operate in the same way as the first inductor section and first surge absorption section.

That is, when a signal is input to the second input terminal of the second inductor section, the clamp voltage of the second surge absorption section is normally set higher than the signal voltage and the second surge absorption section is regarded as a high resistance. As a result, the signal is transmitted to the second output terminal via the third and fourth coils.

When a surge is contained in the signal that is input to the second input terminal, the high voltage of the surge exceeds the clamp voltage of the second surge absorption section and is therefore clamped by the reference terminal.

Furthermore, the third coil, second surge absorption section having the capacitance component and the fourth coil constitute a T-type lowpass filter. As per the case mentioned earlier, the high-speed signal reflection that is produced by the LC constant of the lowpass filter is undesirable. Hence, in order to transmit a high frequency signal, the impedance-matched frequency bandwidth is preferably widened.

Therefore, because the image impedance has a frequency characteristic that is dependent on the coupling coefficient of the coil, an image impedance that is not dependent on frequency can be obtained by suitably setting the respective coupling coefficients between the first, second, third, and fourth coils. Further, the effects of the stray capacitance component of the first surge absorption section can be canceled by suitably setting the induction coefficient of the first and second coils, and the effects of the stray capacitance component of the second surge absorption section can be canceled by suitably setting the inductance coefficient of the third and fourth coils.

In this case, when the image impedance of the surge absorption element and characteristic impedance of the signal line in which the surge absorption element is inserted are matched, the reflection of the high speed signal is suppressed and an image impedance with an even frequency characteristic can be implemented over a wide area.

That is, in a state where there is a match between the characteristic impedance of the signal line and the image impedance of the element, substantially 100% of the signal is able to pass through the surge absorption element. Conversely, in the event of a mismatch, a portion of the signal is reflected at the input terminal of the surge absorption element and the reflected signal is the source of waveform disturbance and unnecessary radiation and so forth.

Furthermore, the effective inductance of a differential line to which an opposite-phase signal is input can be increased by utilizing magnetic coupling between the lines. In other words, the dimensions of the coil required to obtain the desired inductance can be increased. That is, in the case of the present invention, when a differential signal is applied to the first and second input terminals, the first, second, third, and fourth coils have a positive magnetically coupled state with respect to one another. That is, the magnetic fields produced by the respective coils are strengthened.

Because the first to fourth coils are constituted having a positive magnetically coupled state with respect to one another, the induction coefficients of the first to fourth coils can be small in comparison with those when the first to fourth coils do not have a positive magnetically coupled state. Hence, the length of the first to fourth coils can be reduced. As a result, the surge absorption element can be miniaturized.

Further, a first surge absorption layer is preferably made of a semiconductor ceramic and a second surge absorption layer is preferably made of a semiconductor ceramic.

In this case, the first and second surge absorption sections can be rendered varistors by using a semiconductor ceramic for the first and second surge absorption layers. That is, when the withstand voltage applied to the respective surge absorption sections exceeds a threshold value, the resistance value of semiconductor ceramic drops abruptly and a large surge voltage is able to flow to the reference terminal.

Furthermore, the inductor section comprises: a first insulation layer that is interposed between the first and second coils; a second insulation layer that is interposed between the second and third coils; and a third insulation layer that is interposed between the third and fourth coils; and the first, second, third, and fourth coils are preferably arranged such that, when opposite-phase signals are applied to the first and second input terminals, the orientation of the magnetic fields produced in the first, second, third, and fourth coils is the same orientation and arranged such that at least a portion of a region in the first coil, a region in the second coil, a region in the third coil, and a region in the fourth coil overlaps when viewed from the coil-stacking direction.

Thus, the first insulation layer is provided between the first and second coils, the second insulation layer is provided between the second and third coils, and the third insulation layer is provided between the third and fourth coils, and the first to fourth coils can be strongly coupled magnetically when current is flowing in the first to fourth coils by arranging the first to fourth coils so that a region in the first coil, a region in the second coil, a region in the third coil, and a region in the fourth coil at least partially overlap when viewed from the coil-stacking direction.

Furthermore, the first to fourth coils are arranged so that, when opposite-phase signals are applied to the first and second input terminals, the orientation of the magnetic field produced in the first to fourth coils is the same orientation and, hence, the first to fourth coils mutually strengthen the magnetic fields thereof, that is, assume a positive magnetically coupled state. Hence, the induction coefficient of the first to fourth coils can be reduced in comparison with the induction coefficient when the first to fourth coils do not possess a positive magnetic coupled state. As a result, miniaturization of the surge absorption element can be more reliably achieved.

The first surge absorption layer, second surge absorption layer, first insulation layer, second insulation layer, and third insulation layer preferably constitute a rectangular parallelepiped overall body; the first and second input terminals are preferably formed on a first side of the body; and the first and second output terminals are preferably formed on a second side of the body.

Thus, first and second input terminals are formed on the first side of a right-angled parallelepiped body constituted entirely by the first surge absorption layer, the second surge absorption layer, the first insulation layer, the second insulation layer, and the third insulation layer and, by forming first and second output terminals on the second side of the body, the first input terminal, second input terminal, first output terminal, and second output terminal can be easily connected to an external circuit.

Further, the first and second sides preferably face one another.

In this case, because the first and second input terminals formed on the first side and the first and second output terminals formed on the second side one another, establishing correspondence between the first and second input terminals and the first and second output terminals is straightforward. As a result, connection errors can be prevented when the first and second input terminals and the first and second output terminals are connected to external circuits.

Further, the other end of the first coil is preferably exposed on the outer surface of the body; the other end of the second coil is preferably exposed on the outer surface of the body; the exposed sections of the first and second coils are preferably connected via a first external conductor formed on the outer surface of the body; the other end of the third coil is preferably exposed on the outer surface of the body; the other end of the fourth coil is preferably exposed on the outer surface of the body; and the exposed sections of the third and fourth coils are preferably connected via a second external conductor formed on the outer surface of the body.

In this case, exposed portions exposed on the outer surface of the body of the other ends of the first to fourth coils are connected via first and second external conductors formed on the outer surface of the body. Because the coils are connected by using external conductors, the other end of the first to fourth coils can be connected easily and reliably.

Further, the reference terminal is preferably formed on the outer surface of the body and disposed between the first and second input terminals or between the first and second output terminals.

In this case, because a reference terminal is formed on the outer surface of the body, the reference terminal is easily grounded. Further, by arranging the reference terminal between the first and second input terminals or between the first and second output terminals, degradation of the impedance matching as a result of the occurrence of unnecessary coupling between the first and second input terminals or between the first and second output terminals can be prevented.

Furthermore, the surge absorption element preferably further comprises a first capacitor that is interposed between the first input terminal and the first output terminal; and a second capacitor that is interposed between the second input terminal and the second output terminal.

When a signal is applied to the first and second input terminals, a first capacitor that is interposed between the first input terminal and the first output terminal and a second capacitor that is interposed between the second input terminal and the second output terminal act in the same way as the magnetic coupling of the first and second coils and the magnetic coupling of the third and fourth coils. Accordingly, when the capacitance values of the first and second capacitors have suitable values, the magnetic coupling of the first and second coils and the magnetic coupling of the third and fourth coils can be changed flexibly.

Further, the first capacitor preferably comprises a fifth internal electrode that is connected to the first input terminal; a sixth internal electrode that is connected to the first output terminal; and an insulation layer that is interposed between the fifth and sixth internal electrodes; and the second capacitor preferably comprises a seventh internal electrode that is connected to the second input terminal; an eighth internal electrode that is connected to the second output terminal; and an insulation layer that is interposed between the seventh and eighth internal electrodes.

Thus, more straightforward formation is possible by stacking the insulation layers and fifth to eighth internal electrodes.

The surge absorption element according to a second invention comprises (A) an inductor section that comprises a first coil one end of which is connected to a first input terminal; a second coil one end of which is connected to a first output terminal and the other end of which is connected to the other end of the first coil; a third coil one end of which is connected to a second input terminal; and a fourth coil one end of which is connected to a second output terminal and the other end of which is connected to the other end of the third coil; (B) a first surge absorption section that comprises a first internal electrode that is connected to a first interconnect between the first coil and the second coil of the inductor section; a second internal electrode that faces the first internal electrode and is connected to a reference terminal; and a first surge absorption layer that is interposed between the first internal electrode and the second internal electrode; (C) a second surge absorption section that comprises a third internal electrode that is connected to a second interconnect between the third coil and the fourth coil of the inductor section; a fourth internal electrode that faces the third internal electrode and is connected to the reference terminal; and a second surge absorption layer that is interposed between the third internal electrode and fourth internal electrode; (D) a first capacitor that is interposed between the first input terminal and the first output terminal; and (E) a second capacitor that is interposed between the second input terminal and the second output terminal, (F) wherein the surge absorption element is constituted such that, when opposite-phase signals are applied to the first and second input terminals, the first coil and the third coil have a positive magnetically coupled state with respect to one another and the second coil and the fourth coil have a positive magnetically coupled state with respect to one another.

According to the present invention, the functions of the inductor sections and first and second surge sections are the same as those of the first invention above but differ in that first and second capacitors are interposed between the respective I/O elements. Further, although all the coils had a positive magnetic coupling in the first invention, in the present invention, at least the first coil has a positive magnetically coupled state with the third coil and the second coil may have a positive magnetically coupled state with the fourth coil.

That is, in the first invention, an image impedance that is not dependent on frequency was obtained by suitably setting each of the coupling coefficients between the respective coils, and the effects of the stray capacitance components of the first and second surge absorption sections are also canceled by suitably setting the inductance coefficients of the first and second coils and the inductance coefficients of the third and fourth coils, whereby impedance matching is established.

On the other hand, according to the present invention, an image impedance that is not dependent on frequency can be obtained by affording the capacitance values of the first and second capacitors suitable values by using a capacitor that is interposed between the I/O terminals and the effects of the stray capacitance components of the first and second surge absorption sections are canceled by suitably setting the capacitance values of the first and second capacitors and the inductance coefficients of the first to fourth coils, whereby the image impedance and the characteristic impedance of the surge absorption elements can be matched. As a result, high-speed signal reflection can be suppressed and an image impedance with an even frequency characteristic can be implemented over a wide bandwidth.

Further, the constitution is such that the first and third coils have a positive magnetically coupled state with respect to one another and the second and fourth coils have a positive magnetically coupled state with respect to one another. Hence, the induction coefficients of the first to fourth coils can be reduced in comparison with the induction coefficients when the first to fourth coils do not have a positive magnetically coupled state. Accordingly, the length of the first to fourth coils can be shortened. As a result, miniaturization of the surge absorption elements can be achieved.

The surge absorption circuit according to a third invention comprises (A) a first coil one end of which is connected to a first input terminal; (B) a second coil one end of which is connected to a first output terminal and the other end of which is connected to the other end of the first coil; (C) a third coil one end of which is connected to a second input terminal; (D) and a fourth coil one end of which is connected to a second output terminal and the other end of which is connected to the other end of the third coil; (E) a first surge absorption section one end of which is connected to a first interconnect between the first and second coils and the other end of which is connected to a reference terminal; and (F) a second surge absorption section one end of which is connected to a second interconnect between the third and fourth coils and the other end of which is connected to the reference terminal, (G) wherein the surge absorption circuit is constituted such that, when opposite-phase signals are applied to the first and second input terminals, the first, second, third, and fourth coils have a positive magnetically coupled state with respect to one another.

In the surge absorption circuit of the present invention, the functions of the first to fourth coils and first and second surge sections are the same as those of the surge absorption element of the first invention above. Hence, high-speed signal reflection can be suppressed and an image impedance with an even frequency characteristic can be implemented over a wide bandwidth. In addition, miniaturization is possible for elements employing the surge absorption circuit of the present invention.

Further, the surge absorption circuit of the present invention preferably further comprises: a first capacitor one end of which is connected to the first input terminal and the other end of which is connected to the first output terminal; and a second capacitor one end of which is connected to the second input terminal and the other end of which is connected to the second output terminal.

When a signal is applied to the first and second input terminals, a first capacitor that is interposed between the first input terminal and the first output terminal and a second capacitor that is interposed between the second input terminal and the second output terminal act in the same way as the magnetic coupling of the first and second coils and the magnetic coupling of the third and fourth coils. Accordingly, when the capacitance values of the first and second capacitors have suitable values, the magnetic coupling of the first and second coils and the magnetic coupling of the third and fourth coils can be changed flexibly.

The surge absorption circuit according to a fourth invention comprises (A) a first coil one end of which is connected to a first input terminal; (B) a second coil one end of which is connected to a first output terminal and the other end of which is connected to the other end of the first coil; (C) a third coil one end of which is connected to a second input terminal; (D) a fourth coil one end of which is connected to a second output terminal and the other end of which is connected to the other end of the third coil; (E) a first surge absorption section one end of which is connected to a first interconnect between the first and second coils and the other end of which is connected to a reference terminal; (F) a second surge absorption section one end of which is connected to a second interconnect between the third and fourth coils and the other end of which is connected to the reference terminal; (G) a first capacitor one end of which is connected to the first input terminal and the other end of which is connected to the first output terminal; and (H) a second capacitor one end of which is connected to the second input terminal and the other end of which is connected to the second output terminal, (I) wherein the surge absorption circuit is constituted such that, when opposite-phase signals are applied to the first and second input terminals, the first and third coils have a positive magnetically coupled state with respect to one another and the second and fourth coils have a positive magnetically coupled state with respect to one another.

In the surge absorption circuit of the present invention, the functions of the first to fourth coils and the first and second surge sections are the same as those of the surge absorption elements of the second invention above. Hence, high-speed signal reflection can be suppressed and an image impedance with an even frequency characteristic can be implemented over a wide bandwidth. In addition, miniaturization is possible for elements employing the surge absorption circuit of the present invention.

The present invention is able to provide a surge absorption element that is small and superior with respect to impedance matching even with respect to a high-speed signal.

DESCRIPTION OF THE PREFERRED EMBODIMENTS

Preferred embodiments of the present invention will be described in detail hereinbelow with reference to the attached drawings. Further, in the description, the same numerals are used for the same elements or for elements with the same functions, and repetitive description is omitted. Further, the words 'up' and 'down' are used in the description and correspond with a vertical direction in each of the drawings.

First Embodiment

Figure 1A:
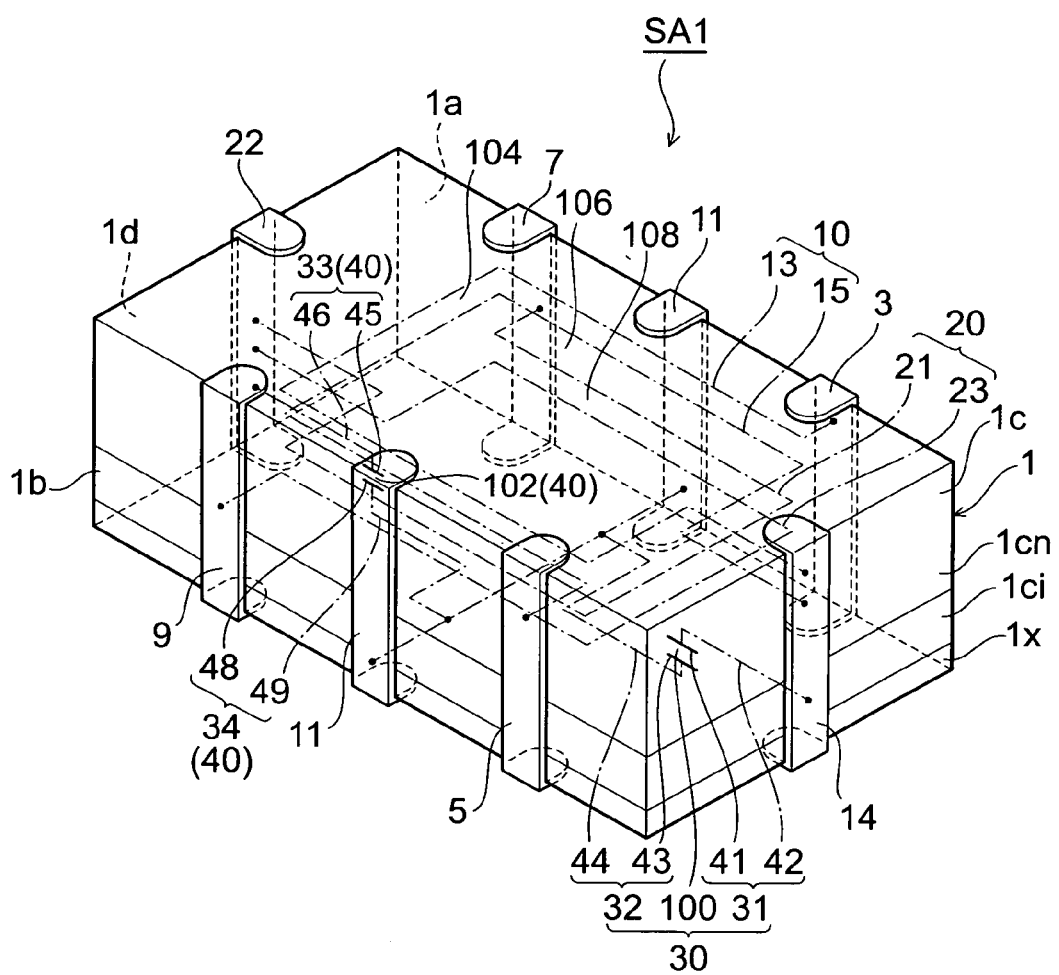
FIGS. 1A and 1B are schematic perspective views of a surge absorption element of a first embodiment.
Figure 1B:
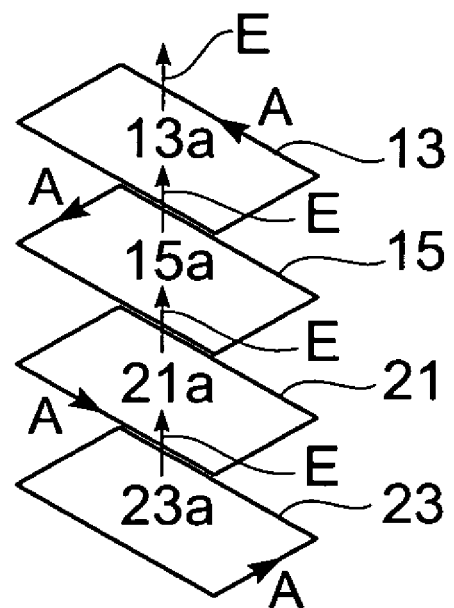

First, the constitution of a surge absorption element SA1 of the first embodiment will first be described on the basis of FIGS. 1A and 1B. FIGS. 1A and 1B are schematic perspective views of a surge absorption element of the first embodiment.

As shown in FIG. 1A, the surge absorption element SA1 comprises a body 1, a first input terminal 3, a first output terminal 5, a second input terminal 7, a second output terminal 9, a reference terminal 11, a first external conductor 14, and a second external conductor 22.

A body 1 has a right-angled parallelepiped shape. The length is set at on the order of 1.4 mm, the width is set at on the order of 1.0 mm, and the height is set at on the order of 0.5 mm, for example.

The first input terminal 3, first output terminal 5, second input terminal 7, second output terminal 9, reference terminal 11, first external conductor 14, and second external conductor 22 are formed on the outer surface of the body 1. More specifically, the first input terminal 3 and second input terminal 7 are formed on a first side 1a and the first output terminal 5 and second output terminal 9 are formed on a first side 1a and second side 1b. The first input terminal 3 faces the first output terminal 5 and the second input terminal 7 faces the second output terminal 9.

Two reference terminals 11 are formed. One reference terminal 11 is disposed between the first input terminal 3 and second input terminal 7 and the other reference terminal 11 is formed between the first output terminal 5 and second output terminal 9. The reference terminal 11 disposed between the first and second input terminals 3 and 7 and the reference terminal 11 disposed between the first and second output terminals 5 and 9 are connected inside the body 1. Further, the respective reference terminals 11 need not necessarily be connected within the body 1. When the surge absorption element SA1 is mounted on a substrate, the respective reference terminals 11 are connected to ground and, unless the respective reference terminals 11 function as ground terminal electrodes, the connection between the reference terminals 11 in the body 1 is not required.

The first external conductor 14 is formed on a first end face 1c and the second external conductor 22 is formed on a second end face 1d opposite the first end face 1c. The first external conductor 14 is connected to the reference terminal 11 via an internal electrode part 42 and a surge absorption section 30 and the second external conductor 22 is connected to the reference terminal 11 via an internal electrode part 46 and a surge absorption section 40.

Opposite-phase signals, that is, complementary differential signals are input to the first input terminal 3 and second input terminal 7. More specifically, when a positive phase signal is input to the first input terminal 3, an opposite-phase signal is input to the second input terminal 7. The reference terminal 11 functions as a ground terminal electrode of the surge absorption element SA1.

Body 1 comprises an inductor region 1cn, a varistor region ici, and an insulation region 1x and these regions are stacked.

The inductor region 1cn has a first inductor section 10 and a second inductor section 20 as inductor sections. The first inductor section 10 comprises a first coil 13, a second coil 15, and a first insulation layer 104 that is interposed between the first coil 13 and second coil 15. The first coil 13 and second coil 15 has a substantially rectangular ring-like part one end of which is open.

One end of the first coil 13 is exposed on the first side 1a of the body 1 and connected to the first input terminal 3. One end of the second coil 15 is exposed on the second side 1b of the body 1 and connected to the first output terminal 5. The other end of the second coil 15 is connected to the other end of the first coil 13.

The other end of the first coil 13 and the other end of the second coil 15 are exposed on the outer surface of the body 1. More specifically, the other ends of the first and second coils 13 and 15 are exposed on the first end face 1c of the body 1 and the exposed sections of the first and second coils 13 and 15 are each connected to the first external conductor 14. As a result, the other end of the first coil 13 and the other end of the second coil 15 are electrically connected via the first external conductor 14. Further, the other end of the first coil 13 and the other end of the second coil 15 may be connected via a through-hole conductor or the like formed inside the body 1 rather than via the first external conductor 14.

The second inductor section 20 comprises a third coil 21, a fourth coil 23, and a third insulation layer 108 that is interposed between the third coil 21 and fourth coil 23. Further, a second insulation layer 106 is interposed between the third coil 21 and the second coil 15 of the first inductor section 10. The third coil 21 and fourth coil 23 comprise a substantially rectangular ring-like part one end of which is open.

One end of the third coil 21 is exposed on the first side 1a of the body 1 and connected to the second input terminal 7. One end of the fourth coil 23 is exposed on the second side 1b of the body 1 and connected to the second output terminal 9. The other end of the fourth coil 23 is connected to the other end of the third coil 21.

The other end of the third coil 21 and the other end of the fourth coil 23 are exposed on the outer surface of the body 1. More specifically, the other ends of the third and fourth coils 21 and 23 are exposed on the second end face 1d of the body 1 and the exposed portions of the third and fourth coils 21 and 23 are connected to the second external conductor 22. As a result, the other end of the third coil 21 and the other end of the fourth coil 23 are electrically connected via the second external conductor 22. Further, the third coil 21 and fourth coil 23 may be connected via the through-hole conductor formed inside the body 1 rather than via the external conductor 22.

As mentioned earlier, the first coil 13 has a substantially rectangular ringlike part one end of which is open. As shown in FIG. 1B, the substantially rectangular region surrounded by the ringlike part will be called the internal region (region inside the first coil) 13a of the first coil 13 hereinbelow. As per the second to fourth coils 15, 21, and 23, the regions surrounded by the ringlike parts will be known as the internal regions 15a, 21a, and 23a of the second to fourth coils 15, 21, and 23.

The internal region 13a of the first coil 13, the internal region 15a of the second coil 15, the internal region 21a of the third coil 21, and the internal region 23a of the fourth coil 23 are arranged so that at least a portion thereof overlaps when viewed from the coil-stacking direction, that is, from the stacking direction of the first to fourth coils 13, 15, 21, and 23. In this embodiment, the internal regions 13a, 15a, 21a, and 23a of the first to fourth coils 13, 15, 21, and 23 overlap one another entirely. Further, in order to establish an effective positive magnetic coupling, the surface areas of the overlapping parts are preferably substantially 50% or more of the respective surface areas of each of the internal regions 13a, 15a, 21a, and 23a of the first to fourth coils 13, 15, 21, and 23.

The first to fourth coils 13, 15, 21, and 23 are disposed so that, when a differential signal is applied to the first and second input terminals 3 and 7, the orientation of the magnetic field produced in the first to fourth coils 13, 15, 21, and 23 is the same orientation.

More specifically, the first to fourth coils 13, 15, 21, and 23 are disposed so that a current flows in the direction of arrow A, that is, in a direction belonging to a counterclockwise direction when viewed from the coil-stacking direction when a positive-phase signal is input to the first input terminal 3 and an opposite-phase signal is input to the second input terminal 7. When a current is flowing in the direction of arrow A, a magnetic field is produced in the direction of arrow E in the internal regions 13a, 15a, 21a, and 23a of the first to fourth coils 13, 15, 21, and 23. Because the internal regions 13a, 15a, 21a, and 23a of the first to fourth coils 13, 15, 21, and 23 overlap one another, the first to fourth coils 13, 15, 21, and 23 mutually strengthen the magnetic fields thereof. A state where the magnetic fields are strengthened in this manner is known as a positive magnetically coupled state.

The varistor region 1*ci* comprises a first surge absorption section 30 and a second surge absorption section 40. The first and second surge absorption sections 30 and 40 are varistors. The first surge absorption section 30 comprises a first internal electrode 31 connected to the first external conductor 14, a second internal electrode 32 connected to the reference terminal 11, and a first surge absorption layer 100 that is interposed between the first internal electrode 31 and second internal electrode 32.

The first internal electrode 31 comprises a first electrode part 41 and a second electrode part 42. The second electrode part 42 is extended from the first electrode part 41 to be exposed on the first end face 1*c* of the body 1 and functions as an extended conductor. The second electrode part 42 exposed on the first end face 1*c* is connected to the first external conductor 14. The first electrode part 41 is electrically connected to the first external conductor 14 via the second electrode part 42.

The second internal electrode 32 comprises a first electrode part 43 and a second electrode part 44. The second electrode part 44 is extended from the first electrode part 43 to be exposed on the first side 1*a* of the body 1 and functions as an extended conductor. The second electrode part 44 exposed on the first side 1*a* is connected to the reference terminal 11. The first electrode part 43 is electrically connected to the reference terminal 11 via the second electrode part 44.

The second surge absorption section 40 comprises a third internal electrode 33 that is connected to the second external conductor 22, a fourth internal electrode 34 connected to the reference terminal 11, and a second surge absorption layer 102 that is interposed between the third internal electrode 33 and fourth internal electrode 34.

The third internal electrode 33 comprises a first electrode part 45 and a second electrode part 46. The second electrode part 46 is extended from the first electrode part 45 to be exposed on the second end face 1*d* of the body 1 and functions as an extended electrode. The second electrode part 46 exposed on the second end face 1*d* of the body 1 is connected to the second external conductor 22. The first electrode part 45 is electrically connected to the second external conductor 22 via the second electrode part 46.

The fourth internal electrode 34 comprises a first electrode part 48 and a second electrode part 49. The second electrode part 49 is extended from the first electrode part 48 to be exposed on the second side 1*b* of the body 1 and functions as an extended conductor. The second electrode part 49 exposed on the second side 1*b* is connected to the reference terminal 11. The first electrode part 48 is electrically connected to the reference terminal 11 via the second electrode part 49.

The inductor region 1*cn* is constituted by a ceramic material the principal component of which is ZnO. The semiconductor ceramic material constituting the inductor region 1*cn* may contain a metallic element such as rare earth elements (Pr, for example), K, Na, Cs, and Rb as additives in addition to ZnO. Among these elements, the addition of rare earth elements is particularly preferable. Through the addition of rare earth elements, the difference in the rate of variation in the volume of the inductor region 1*cn* and varistor region 1*ci* can be easily reduced.

Further, Cr, Ca, and Si may also be included with the objective of increasing the bonding characteristic of the varistor region 1*ci* with the inductor region 1*cn*. The metallic element contained in the inductor region 1*cn* is able to exist in a variety of forms such as a metallic simple substance or oxide. A suitable content of the additive contained in the inductor region 1 cn is preferably equal to or more than 0.02 mol % and equal to or less than 2 mol % in the total amount of ZnO contained in the inductor region 1*cn*. The content of the metallic element can be measured by using an inductively coupled high-frequency plasma light-emitting analysis device (ICP), for example.

The inductor region 1*cn* does not substantially contain Co, which is contained in the varistor region 1*ci*. Here, the state 'does not substantially contain' refers to a state when these elements are intentionally excluded as raw materials when forming the inductor region 1*cn* (weight % equal to or less than 1%). For example, when these elements are unintentionally included as a result of diffusion or the like from the varistor region lci to the inductor region 1*cn*, this corresponds to the 'does not substantially contain' state. Further, the inductor region 1*cn* may further contain another metallic element with the object of further increasing the characteristic. The conductive material contained in the first to fourth coils 13, 15, 21, and 23 is not particularly restricted but a conductive material that comprises Pd or an Ag—Pd alloy is preferable.

The varistor region 1*ci* is constituted by a semiconductor ceramic material the principal component of which is ZnO. The ceramic material further contains, as additives, at least one type of element selected from the group containing rare earth elements and Bi, and Co. That is, the varistor region 1*ci* comprises a semiconductor ceramic material in which the resistance value decreases abruptly when a voltage at or above the threshold value is applied and contains Co in addition to the rare earth element. Because the varistor region 1*ci* is constituted by such a material, the clamp voltage is higher than the voltage of the signal that is input to the first input terminal in the first surge absorption section 30 contained in the varistor region 1*ci*. The first and second absorption layers 100 and 102 of the first and second surge absorption sections 30 and 40 are formed by the same material as the varistor region 1*ci*.

Accordingly, the first and second surge absorption layers 100 and 102 have a superior voltage nonlinear characteristic, that is, a varistor characteristic and a high permittivity ($\epsilon$). The semiconductor ceramic material constituting the varistor region 1*ci* may further comprise Al as an additive. When the semiconductor ceramic material contains Al, the varistor region 1*ci* has a low resistance. The rare earth element contained as an additive may be Pr.

The metallic element constituting these additives can exist in the form of a metallic simple substance or oxide or the like in the varistor region 1*ci*. Further, the varistor region 1*ci* may further contain a metallic element (Cr, Ca, Si, K or the like, for example) other than the metallic element mentioned earlier as an additive with the object of further increasing the characteristic. The conductive material contained in the first to fourth internal electrodes 31, 32, 33, and 34 is not particularly restricted but a conductive material that comprises Pd or an Ag—Pd alloy is preferable.

The material constituting the insulation region 1*x* is not especially restricted and a variety of ceramic materials can be applied. From the perspective of reducing detachment from the varistor region 1*ci*, a material that comprises ZnO as the principal component as per the varistor region 1*ci* is preferable.

The first and second input terminals 3 and 7, the first and second output terminals 5 and 9, the reference terminal 11, and the first and second external conductors 14 and 22 preferably comprise a metallic material that can be favorably electrically connected to a metal such as Pd that constitutes the first to fourth coils 13, 15, 21, and 23 and the first to fourth internal electrodes 31, 32, 33, and 34. For example, Ag is a material with favorable electrical connectivity with the first to fourth coils 13, 15, 21, and 23 and the first to fourth internal electrodes 31, 32, 33, and 34 that comprise Pd and, by virtue of having favorable adhesion to the end face of the body 1, is suitable as an external electrode material.

An Ni-plated layer (not illustrated) and an Sn-plated layer (not illustrated) or the like are formed in order on the surface of the first and second input terminals 3 and 7, the first and second output terminals 5 and 9, the reference terminal 11, and the first and second external conductors 14 and 22. As a result of forming such plated layers, the solder heat resistance and solder wettability and so forth can typically be increased when the surge absorption element SA1 is mounted on a substrate or the like by means of solder reflow.

Figure 2:
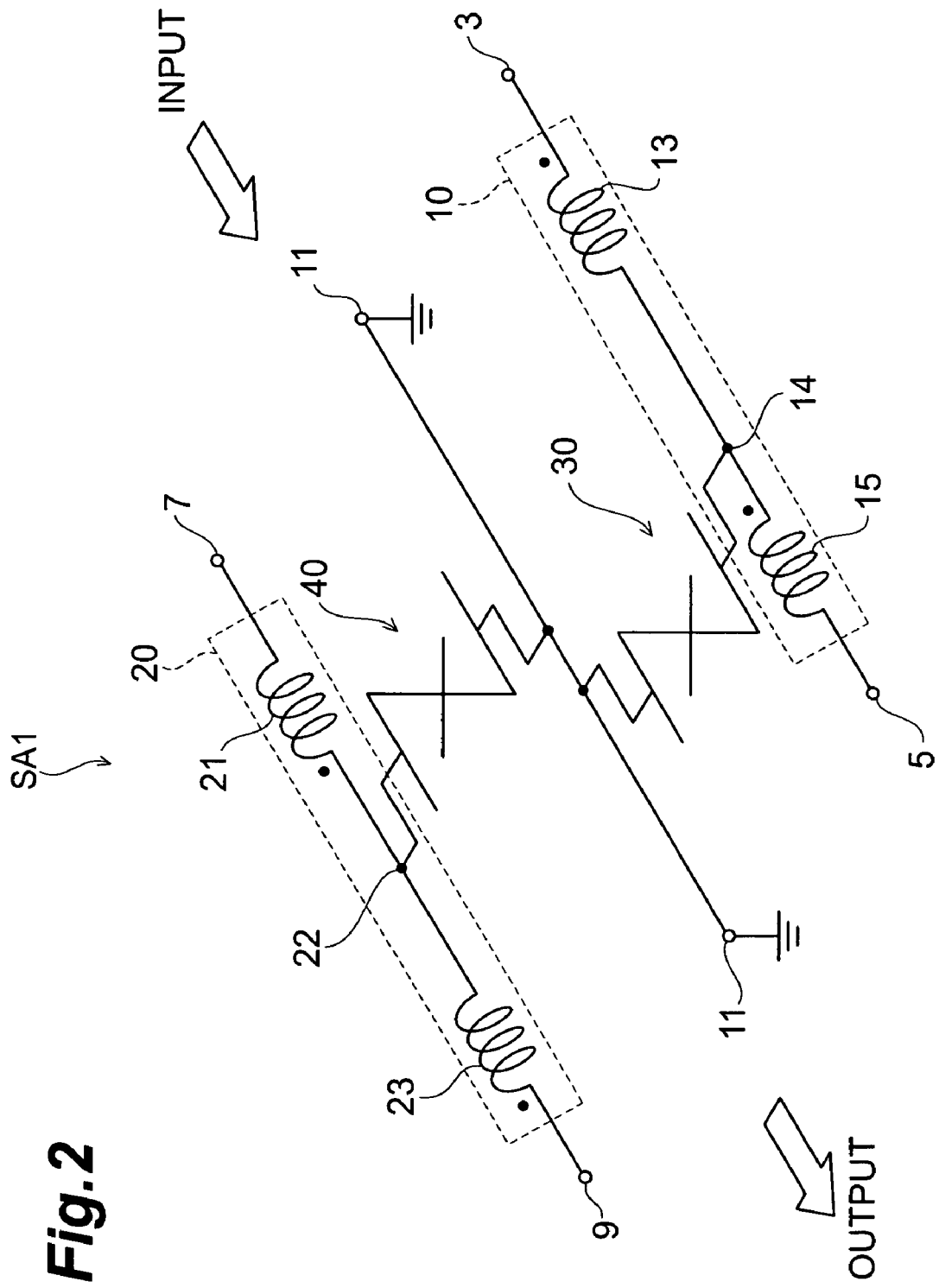
FIG. 2 serves to illustrate the constitution of the circuit of the surge absorption element of the first embodiment.
Figure 3:
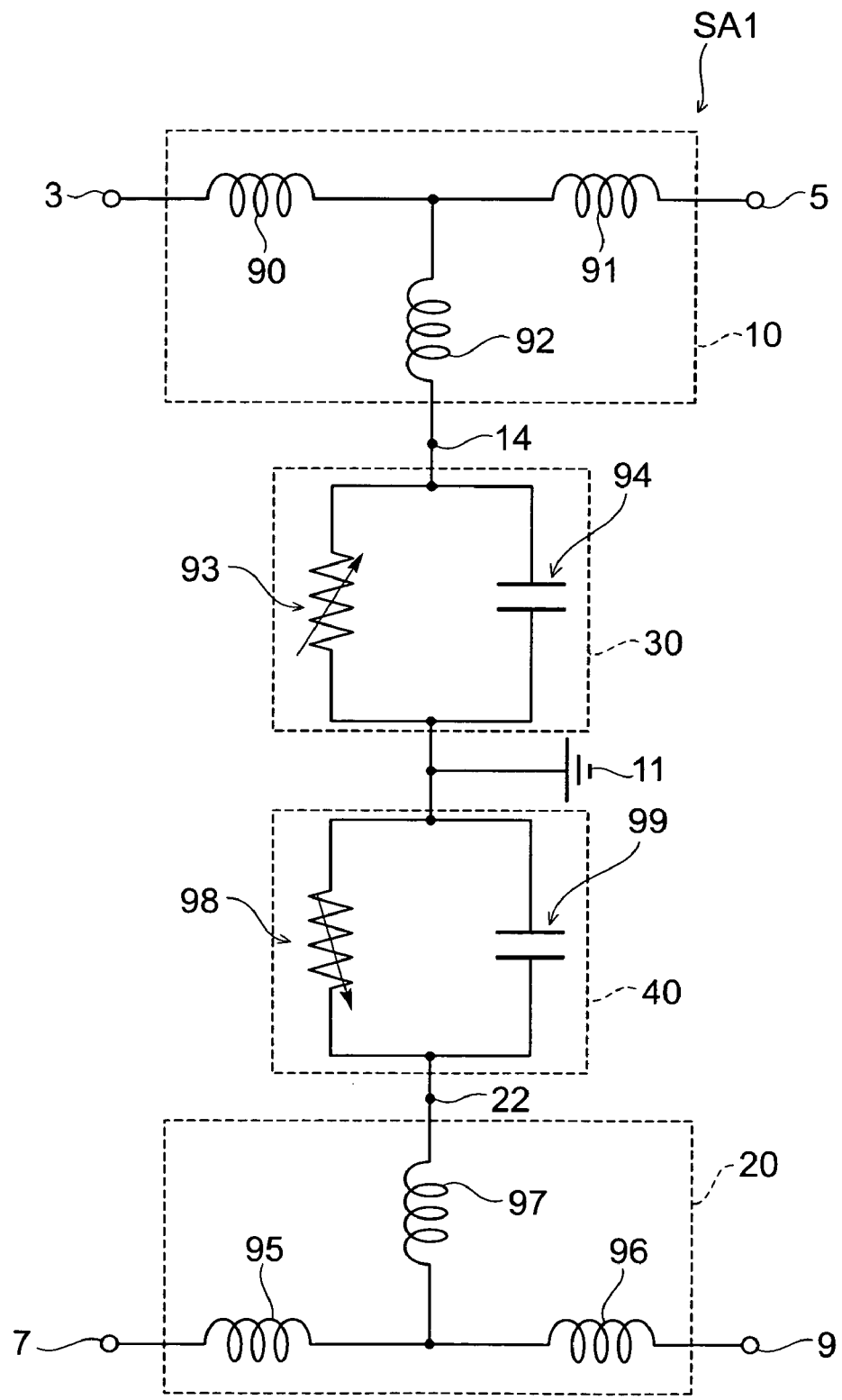
FIG. 3 shows an equivalent circuit of the circuit constitution shown in FIG. 2.

The constitution of the circuit of the surge absorption element SA1 (surge absorption circuit) with the abovementioned constitution will be described next on the basis of FIGS. 2 and 3. FIG. 2 serves to illustrate the circuit constitution of the surge absorption element according to the first embodiment. FIG. 3 shows an equivalent circuit of the circuit constitution shown in FIG. 2.

As shown in FIG. 2, the first surge absorption section 30 is connected between a first interconnect (first external conductor 14) between the first coil 13 and second coil 15, and the reference terminal 11. The second surge absorption section 40 is connected between a second interconnect (second external conductor 22) between the third coil 21 and fourth coil 23 and the reference terminal 11.

The first inductor section 10 is connected between the first input terminal 3 and first output terminal 5. The second inductor section 20 is connected between the second input terminal 7 and second output terminal 9. The start of the winding of the first coil 13 is on the side of the first input terminal 3. The start of the winding of the second coil 15 is the side connected to the first coil 13 (the side of the external conductor 14 in this embodiment). The start of the winding of the third coil 21 is the side connected to the fourth coil 23 (the side of the external conductor 22 in this embodiment). The start of the winding of the fourth coil 23 is the side of the second output terminal 9. The first to fourth coils 13, 15, 21, and 23 have a positive magnetically coupled state with respect to one another as mentioned earlier.

The first inductor section 10 can be converted to a first inductance component 90, a second inductance component 91, and a third inductance component 92 as shown in FIG. 3. The first inductance component 90 and second inductance component 91 are connected in series between the first input terminal 3 and first output terminal 5. The third inductance component 92 is connected between the interconnect between the first inductance component 90 and second inductance component 91 connected in series, and the first surge absorption section 30.

The second inductor section 20 can be converted into a fourth inductance component 95, a fifth inductance component 96 and a sixth inductance component 97. The fourth inductance component 95 and fifth inductance component 96 are connected in series between the second input terminal 7 and second output terminal 9. The sixth inductance component 97 is connected between an interconnect connecting the serially connected fourth inductance component 95 and fifth inductance component 96, and the second surge absorption section 40.

Here, supposing that the inductance coefficient of the first to fourth coils 13, 15, 21, and 23 is Lz in each case, the coupling coefficient between the first coil 13 and second coil 15 and the third coil 21 and fourth coil 23 is Kz in each case, and the coupling coefficient between the first coil 13 and third coil 21 and the second coil 15 and fourth coil 23 is Kc, the inductance coefficient of the first, second, fourth, and fifth inductance components 90, 91, 95, and 96 is (1+Kz+Kc) Lz and the inductance coefficient of the third and sixth inductance components 92 and 97 is −KzLz.

The first surge absorption section 30 can be converted into a variable resistor 93 and stray capacitance component 94 that are connected in parallel between the third inductance component 92 and reference terminal 11 as shown in FIG. 3. The second surge absorption section 40 can be converted into a variable resistor 98 and a stray capacitance component 99 that are connected in parallel between the sixth inductance component 97 and reference terminal 11. The variable resistors 93 and 98 normally have a large resistance value and, when a high-voltage surge is applied, the resistance value is reduced. A high-speed signal with a small amplitude can be approximated by means of only the stray capacitance components 94 and 99 in the first and second surge absorption sections 30 and 40.

The image impedance Zdin of the surge absorption element SA1 shown in FIG. 3 is expressed by Equation (1) below. Here, suppose that the capacitance of the stray capacitance components 94 and 99 of the first and second surge absorption sections 30 and 40 is Cz.

Equation 1

$$Zdin = \sqrt{\frac{8(1 + Kz + Kc)Lz \cdot \left\{1 - \frac{1}{2}\omega^2 LzCz(1 - Kz + Kc)\right\}}{Cz}} \quad (1)$$

In Equation (1), if the coupling coefficients Kz and Kc are established to satisfy Equation (2) below, the image impedance Zdin no longer depends on the frequency. If the inductance coefficient Lz is established to satisfy Equation (3) below after establishing the coupling coefficients Kz and Kc in Equation (2), matching between the image impedance Zdin, and the characteristic impedance Zdo of the signal line in which the surge absorption element SA1 is inserted can be matched.

Equation 2

$$Kz - Kc = 1 \quad (2)$$

Equation 3

$$Lz = \frac{Z_{d0}^2 Cz}{8(1 + Kz + Kc)} \quad (3)$$

As can also be seen from Equations (2) and (3), because the coupling coefficients Kz, Kc are chosen arbitrarily, highly flexible circuit design is possible.

The first to fourth coils 13, 15, 21, and 23 have a positive magnetically coupled state with respect to one another and, therefore, the coupling coefficients Kz and Kc have positive values. Accordingly, it can be seen from Equation (2) above that, in comparison with a case where the first to fourth coils 13, 15, 21, and 23 do not have a positive magnetically coupled state, that is, a case where the coupling coefficients Kz and Kc are both zero, the induction coefficient Lz can be reduced. Therefore, the length of the first to fourth coils 13, 15, 21, and 23 can be reduced. Thus, this embodiment permits a small surge absorption element.

Figure 4:
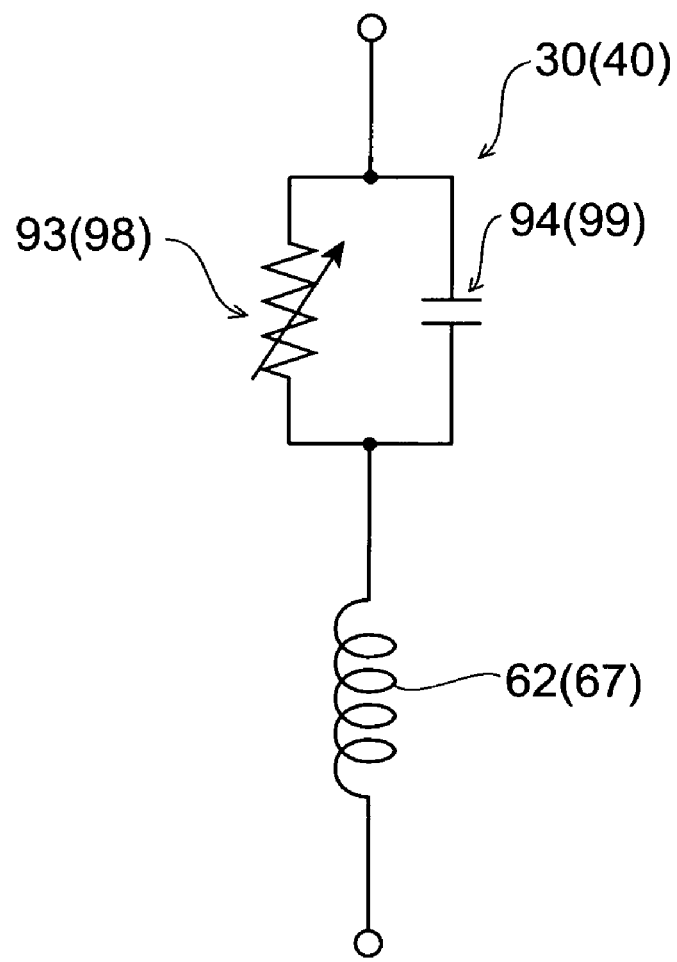
FIG. 4 shows an equivalent circuit of the first and second surge absorption sections.

Further, as shown in FIG. 4, the first and second surge absorption sections 30 and 40 also comprise stray inductance components 62 and 67. The resistance values of the variable resistors 93 and 98 are large in a normal state and become small when a high-voltage surge is applied. However, because the stray capacitance components 94 and 99 and the stray inductance components 62 and 67 exist, when a surge absorption element SA1 is applied to the input side of the semiconductor device that handles high-speed signals as an input signal, the stray capacitance components 94 and 99 and the stray inductance components 62 and 67 are the source of degradation of the high-speed signal. Therefore, in order to apply the surge absorption element SA1 to a circuit that handles high-speed signals, the effect of the stray inductance components 62 and 67 are preferably also reduced as well as the stray capacitance components 94 and 99.

As can also be seen from the equivalent circuit shown in FIG. 3, when the third and sixth inductance components 92 and 97 that have a negative induction coefficient are used, the stray inductance components 62 and 67 of the first and second surge absorption sections 30 and 40 can be canceled. Accordingly, the image impedance Zdin can be matched with the characteristic impedance Zdo even when the stray capacitance components 94 and 99 and the stray inductance components 62 and 67 are contained in the surge absorption element SA1. Further, supposing that the induction coefficient of the stray inductance components 62 and 67 is Le, the image impedance din is expressed by Equation (4) below and, therefore, if the respective coefficients are established to satisfy Equation (5) below, the stray inductance components 62 and 67 of the first and second surge absorption sections 30 and 40 can also be canceled.

Equation 4

$$Zdin = \sqrt{\frac{8(1 + Kz + Kc)Lz}{Cz} \cdot \left\{1 - \frac{1}{2}\omega^2 LzCz\left(1 - Kz + Kc + \frac{2Le}{Lz}\right)\right\}} \quad (4)$$

Equation 5

$$Kz - Kc - \frac{2Le}{Lz} = 1 \quad (5)$$

Thus, according to this embodiment, the surge absorption element SA1 can be a surge absorption element that is superior in terms of impedance matching also with respect to high-speed signals while protecting semiconductor devices or the like from high-voltage static electricity. It was confirmed through experimentation that the surge absorption element of this embodiment is capable of matching the image impedance Zdin and characteristic impedance Zdo with an error within the ±10%.

Figure 5:
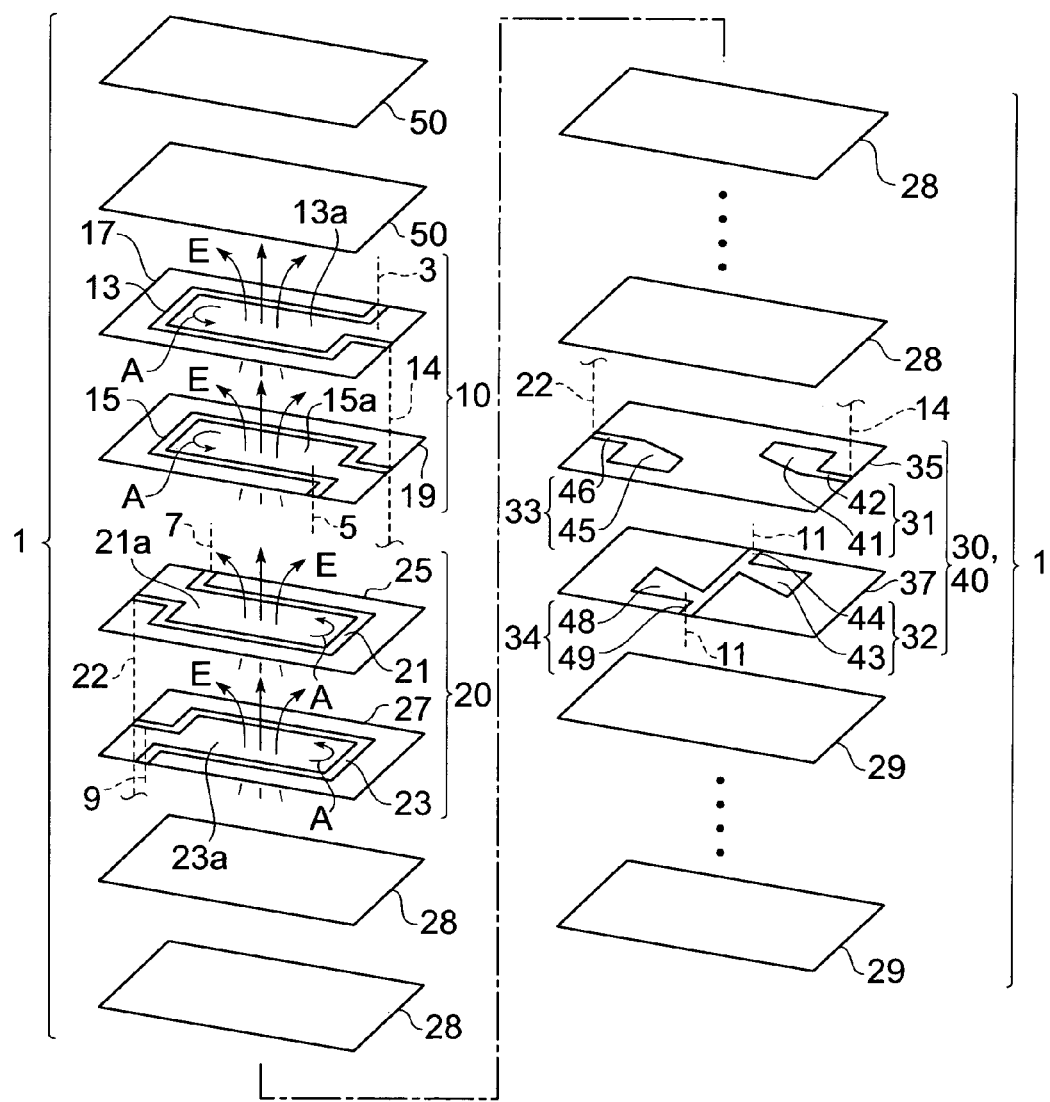
FIG. 5 is an exploded perspective view that serves to illustrate the constitution of the body contained in the surge absorption element according to the first embodiment.

The constitution of the body contained in the surge absorption element according to the first embodiment will be described more specifically next. FIG. 5 is an exploded perspective view that serves to illustrate the constitution of the body contained in the surge absorption element according to the first embodiment.

As shown in FIG. 5, the body 1 exhibits a structure in which an insulator layer 29, the first surge absorption section 30 and second surge absorption section 40, an insulator layer 28, the second inductor section 20, the first inductor section 10, and a protective layer 50 are stacked in order from below.

The protective layer 50 is a layer consisting of a ceramic material that protects a first inductor section 10 and second inductor section 20. The material constituting the protective layer 50 is not particularly restricted and a variety of ceramic materials and so forth can be applied. However, from the perspective of reducing detachment, a material that comprises ZnO as the principal component as per the inductor layers 17, 19, 25, and 27 is preferable.

The first coil 13 of the first inductor section 10 is formed on the inductor layer 17 and the second coil 15 is formed on the inductor layer 19. The third coil 21 of the second inductor section 20 is formed on the inductor layer 25 and the fourth coil 23 is formed on the inductor layer 27. The inductor layer 17 functions as the first insulation layer 104 shown in FIGS. 1A and 1B, the inductor layer 19 functions as the second insulation layer 106, and the inductor layer 25 functions as the third insulation layer 108. The inductor layers 17, 19, 25, and 27 are constituted by a ceramic material in which the principal component is ZnO. The inductor region $1cn$ shown in FIGS. 1A and 1B are formed by the inductor layers 17, 19, 25, and 27 in which the first to fourth coils 13, 15, 21, and 23 are formed.

A plurality of insulator layers (dummy layers) 28 in which an internal conductor is not formed are located between the first and second inductor sections 10 and 20 and the first and second surge absorption sections 30 and 40. The material constituting the insulator layers 28 is not particularly restricted; and a variety of ceramic materials and so forth can be applied. However, from the perspective of reducing detachment, a material that comprises ZnO as the principal component as per the inductor layers 17, 19, 25, and 27 and the surge absorption layers 35 and 37 is preferable.

The first internal electrode 31 of the first surge absorption section 30 and the third internal electrode 33 of the second surge absorption section 40 are formed on the varistor layer 35. The second internal electrode 32 of the first surge absorption section 30 and the fourth internal electrode 34 of the second surge absorption section 40 are formed on a varistor layer 37. The part, of the varistor layer 35, which is interposed between the first internal electrode 31 and the second internal electrode 32 functions as the first surge absorption layer 100 shown in FIGS. 1A and 1B and the part which is interposed between the third internal electrode 33 and the fourth internal electrode 34 functions as the second surge absorption layer 102. The varistor layers 35 and 37 are constituted by a semiconductor ceramic material in which the principal component is ZnO. CO is also contained in the semiconductor ceramic material.

Further, an insulator layer in which an internal conductor is not formed may also be located between the varistor layer 35 and the varistor layer 37. The varistor layers 35 and 37 are constituted by a ceramic material the principal component of which is ZnO. The varistor region $1ci$ shown in FIGS. 1A and 1B is formed by means of the varistor layers 35 and 37 in which the first to fourth internal electrodes 31, 32, 33, and 34 are formed.

Figure 6:
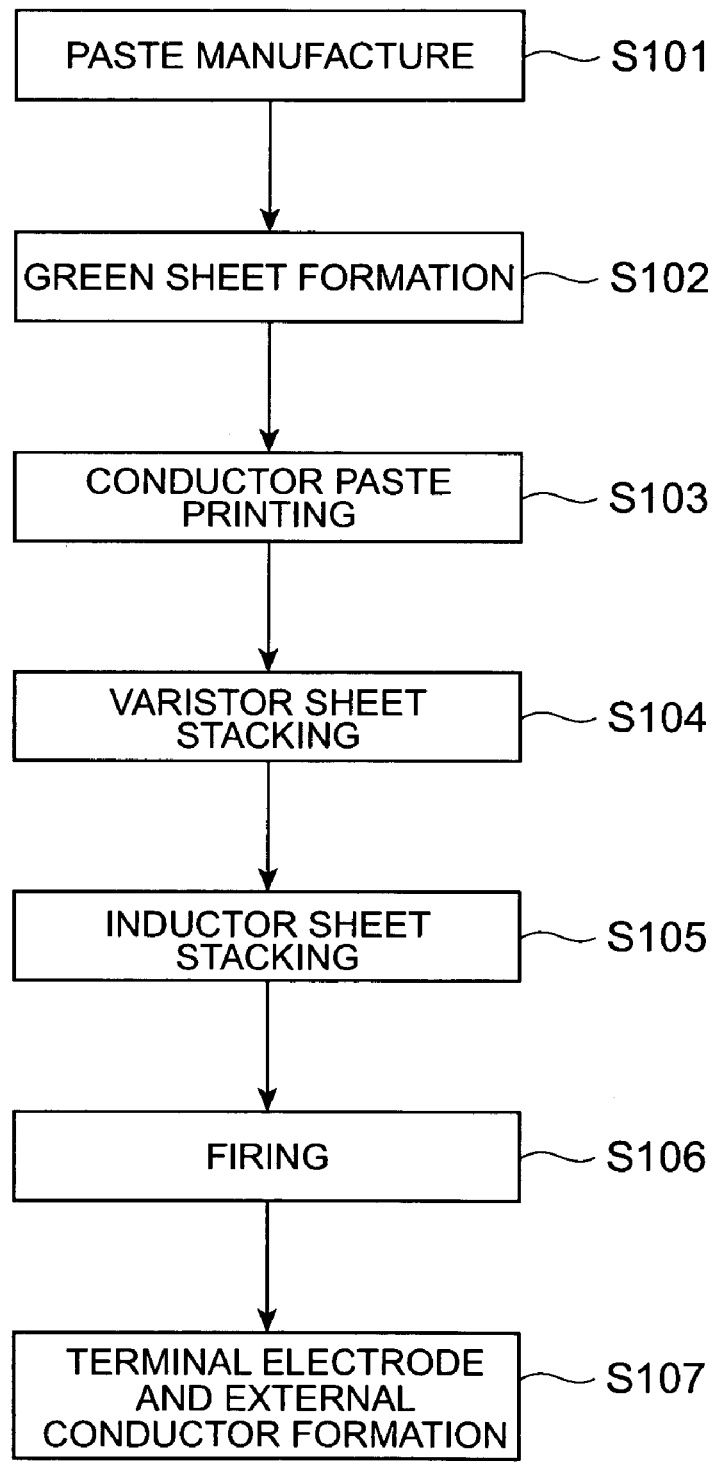
FIG. 6 is a flowchart that serves to illustrate a process of fabricating the surge absorption element of the first embodiment.

The method of fabricating the surge absorption element SA1 according to the first embodiment will be described next with reference to FIG. 6. FIG. 6 is a flowchart that serves to illustrate a process of fabricating the surge absorption element of the first embodiment.

In the fabrication of the surge absorption element SA1, a paste comprising a ceramic material in which the raw materials of the inductor layers 17, 19, 25, and 27 and the varistor layers 35 and 37 is fabricated (step S101). More specifically, the paste for forming the varistor layers 35 and 37 can be prepared by adding Al, Cr, Ca, Si, and K and so forth as required in desired content amounts after firing to ZnO which is the principal component, in addition to at least one type of element and Co selected from the group containing rare earth elements (Pr, for example) and Bi as additives and then adding a binder or the like of these elements and mixing. The metallic element in this case can be added as an oxide, for example.

The paste for forming the inductor layers 17, 19, 25, and 27 can be prepared by adding rare earth elements and a metallic element such as Bi as additives as required to ZnO which is the principal component and then adding a binder or the like to the elements and mixing. The paste for forming the varistor layers 35 and 37 differs from the paste for forming the inductor layers 17, 19, 25, and 27 and Co is not added. The metallic element can also be added in the form of a compound such as an oxide, oxalic acid, or a carbonate, for example. In this case, the compound additive amount is prepared so that the metallic element is in the desired content amount mentioned earlier in the body 1 that has been subjected to firing as will be described subsequently.

The fabricated paste is dried after being applied by means of a doctor blade method or the like on a plastic film or similar, whereby a green sheet made of ceramic material is formed (step S102). As a result, a green sheet (known as an 'inductor sheet' hereinbelow) for forming the inductor layers 17, 19, 25, and 27 and a green sheet for forming the varistor layers 35 and 37 (known as a 'varistor sheet' hereinbelow) are each obtained in the respective quantities required. In the formation of the green sheets, a plastic film or the like may be detached from each sheet immediately after application and drying or may be detached immediately prior to the subsequently described stacking. Further, in the green sheet formation process, a green sheet for the formation of the ZnO-containing insulator layers 28 and 29 and the protective layer 50 is formed by means of a method like that for the inductor sheet and varistor sheet.

Thereafter, a conductor paste for forming first to fourth coils 13, 15, 21, and 23 or the first to fourth internal electrodes 31, 32, 33, and 34 on an inductor sheet or varistor sheet are screen-printed to establish the desired pattern on the respective sheets (step S103). As a result, the respective sheets on which the conductor paste layers with the desired pattern are provided are obtained. For example, conductor pastes include a conductor paste that comprises Pd or an Ag—Pd alloy as the principal component.

Thereafter, the insulator layer 29 and a varistor sheet on which conductor paste layers that correspond with the first to fourth internal electrodes 31, 32, 33, and 34 respectively are provided are sequentially stacked (step S104). Thereafter, the insulator layer 28 and an inductor sheet on which conductor paste layers that correspond with the first to fourth coils 13, 15, 21, and 23 are provided are sequentially stacked thereon (step S105). Furthermore, a stacked body constituting a precursor of the body 1 is obtained by also stacking a green sheet for the formation of the protective layer 50 on the stacked structure and performing crimping.

Thereafter, after the stacked body thus obtained is cut into chip units to establish the desired size, the chips are fired at a predetermined temperature (1000 to 1400° C., for example) to obtain the body 1 (step S106). Subsequently, Li is diffused within the body 1 thus obtained from the surface thereof. Here, after the Li compound has been made to adhere to the surface of the body 1 thus obtained, thermal processing or the like is performed. An airtight rotating pot can be used for the adhesion of the Li compound. The Li compound is not especially restricted and examples thereof include Li oxide, hydroxide, chloride, nitrate, borate, carbonate, and oxalate and so forth, which are compounds that allow Li to be diffused, by means of thermal processing, close to the first to fourth coils 13, 15, 21, and 23 and so forth and the first to fourth internal electrodes 31, 32, 33, and 34 from the surface of the body 1. Further, this Li diffusion process is not necessarily required by the structure of the surge absorption element SA1.

Further, a paste the principal component of which is silver is transferred to the side of the body 1 in which Li was diffused and the paste is then baked, whereupon the first and second input terminals 3 and 7, the first and second output terminals 5 and 9, the reference terminal 11, and the first and second external conductors 14 and 22 are each formed by performing plating to obtain the surge absorption element SA1 (step S107). The plating can be performed by electrical plating and Cu, Ni, and Sn; Ni and Sn; Ni and Au; Ni, Pd, and Au; Ni, Pd, and Ag; or Ni and Ag and so forth can be used, for example.

As mentioned earlier, in this first embodiment, opposite-phase signals are input to the first and second input terminals 3 and 7. When a signal is input to the first input terminal 3, the clamp voltage of the first surge absorption section 30 is set higher than the voltage of the signal thus input and therefore the first surge absorption section 30 is seen as having a high resistance. As a result, a signal is transmitted to the first output terminal 5 via the first coil 13 and second coil 15. When a surge is contained in the signal that is input to the first input terminal 3, the high voltage of the surge exceeds the clamp voltage of the first surge absorption section 30 and is therefore clamped by the reference terminal 11.

Furthermore, when a signal with a phase that is the opposite of the phase of the input signal that is input to the first input terminal 3 is input to the second input terminal 7, the signal is transmitted to the second output terminal 9 via the third coil 21 and fourth coil 23. When a surge is contained in the signal that is input to the second input terminal 7, the high voltage of the surge exceeds the clamp voltage of the second surge absorption section 40 and is therefore clamped by the reference terminal 11.

On the other hand, the first coil 13, first surge absorption section 30 with a capacitance component, and second coil 15 constitute a T-type lowpass filter. The third coil 21, second surge absorption section 40 with a capacitance component, and fourth coil 23 also constitute a T-type lowpass filter. The image impedance of the lowpass filter is fixed by the signal transmission bandwidth but fluctuates greatly at or above the blocked frequencies. The blocked frequencies are decided by the LC constant and there is the risk that a high-order, harmonic component contained in the high-speed signal will be reflected as a result of an impedance mismatch. In order to transmit a high frequency signal without causing same to be reflected, the impedance-matched frequency bandwidth is preferably widened.

Therefore, because the image impedance has a frequency characteristic that is dependent on the coupling coefficient of the coil, an image impedance Zdin that is independent of frequency can be obtained by suitably setting the respective coupling coefficients between the first to fourth coils 13, 15, 21, and 23. Further, the effects of the stray capacitance component of the first and second surge absorption sections 30 and 40 can be canceled by suitably setting the induction coefficient of the first to fourth coils 13, 15, 21, and 23.

Thus, by matching the image impedance that is independent of frequency and in which the effects of the stray capacitance component of the first and second surge absorption sections 30 and 40 have been canceled with the characteristic impedance of the signal line in which the surge absorption element is inserted, high-speed signal reflection can be suppressed and an image impedance with an even frequency characteristic can be implemented over a wide bandwidth.

Furthermore, in this first embodiment, when a differential signal is applied to the first and second input terminals, the first, second, third, and fourth coils have a positive magnetically coupled state. That is, the magnetic fields produced in the respective coils are strengthened. Accordingly, the effective inductance of the first to fourth coils 13, 15, 21, and 23 can be increased, in other words, the dimensions of the first to fourth coils 13, 15, 21, and 23 required in order to obtain the desired inductance can be reduced. As a result, miniaturization of the surge absorption element SA 1 can be achieved.

Furthermore, the first and second surge absorption layers 100 and 102 are formed by the varistor layer 37 and the varistor layer 37 has a principal component ZnO and is constituted by a semiconductor ceramic material containing Co as an additive. Hence, the first and second surge absorption layers 100 and 102 have a superior voltage nonlinear characteristic, that is, a varistor characteristic, and have a high permittivity. As a result, the first and second surge absorption sections 30 and 40 can be a varistor that allows a large surge voltage to flow to the reference terminal 11 when the applied withstand voltage exceeds the threshold value.

In this first embodiment, first to third insulation layers 104, 106, and 108 are provided between the first to fourth coils 13, 15, 21, and 23. The first to third insulation layers 104, 106, and 108 are formed by inductor layers 17, 19, and 25. These inductor layers 17, 19, and 25 has a ZnO principal component and is constituted by a ceramic material that is that substantially contains Co as an additive. Such a material has a resistivity that is sufficiently high as the material constituting the inductor. More specifically, such a material readily has a resistivity that exceeds the preferred 1 MΩ as an inductor material. Hence, the first to fourth coils 13, 15, 21, and 23 between which the first to third insulation layers 104, 106, and 108 are interposed are more rigidly coupled magnetically and are capable of exhibiting a superior inductor characteristic.

Further, the internal regions 13a, 15a, 21a, and 23a of the first to fourth coils 13, 15, 21, and 23 mutually overlap one another when viewed from the coil-stacking direction. Hence, when current flows in the first to fourth coils, the first to fourth coils 13, 15, 21, and 23 can be coupled magnetically. Further, the first to fourth coils 13, 15, 21, and 23 are formed such that the orientation of the magnetic field produced in the first to fourth coils 13, 15, 21, and 23 is the same when a differential signal is applied to the first and second input terminals 3 and 7. Therefore, because the first to fourth coils 13, 15, 21, and 23 reliably have a positive magnetically coupled state with respect to one another, the induction coefficient of the first to fourth coils 13, 15, 21, and 23 can be made reliably small in comparison with the induction coefficient when the first to fourth coils 13, 15, 21, and 23 are not afforded a positive magnetically coupled state with respect to one another. As a result, miniaturization of the surge absorption element can be more reliably achieved.

In this first embodiment, the first and second input terminals 3 and 7 and the first and second output terminals 5 and 9 can be easily connected to the external circuit by forming first and second input terminals 3 and 7 on the first side 1a of the right-angled parallelepiped body 1 and forming the first and second output terminals 5 and 9 on the second side 1b of the body 1. Because the first side 1a and second side 1b face one another, correspondence between the first and second input terminals 3 and 7 and the first and second output terminals 5 and 9 is straightforward. As a result, terminal correction errors can be prevented.

In this first embodiment, the first external conductor 14, which connects the other end of the first coil 13 and the other end of the second coil 15, is formed on the first end face 1c of the body 1, and the second external conductor 14, which connects the other end of the third coil 21 and the other end of the fourth coil 23, is formed on the second end face 1d. By using an external conductor for such connections, the connections of the first coil 13 and second coil 15 and the third coil 21 and fourth coil 23 can be easily and reliably performed.

In this first embodiment, the reference terminal 11 is disposed between the first and second input terminals 3 and 7 and between the first and second output terminals 5 and 9. In this case, the reference terminal 11 is formed on the outer surface of the body 1 and, therefore, the reference terminal 11 can be easily grounded. Further, by disposing the reference terminal 11 between the first and second input terminals 3 and 7 and or between the first and second output terminals 5 and 9, degradation of the impedance matching as a result of the occurrence of unnecessary coupling between the first input terminal 3 and second input terminal 7 or between the first output terminal 5 and second output terminal 9 can be prevented.

Second Embodiment

Figure 7:
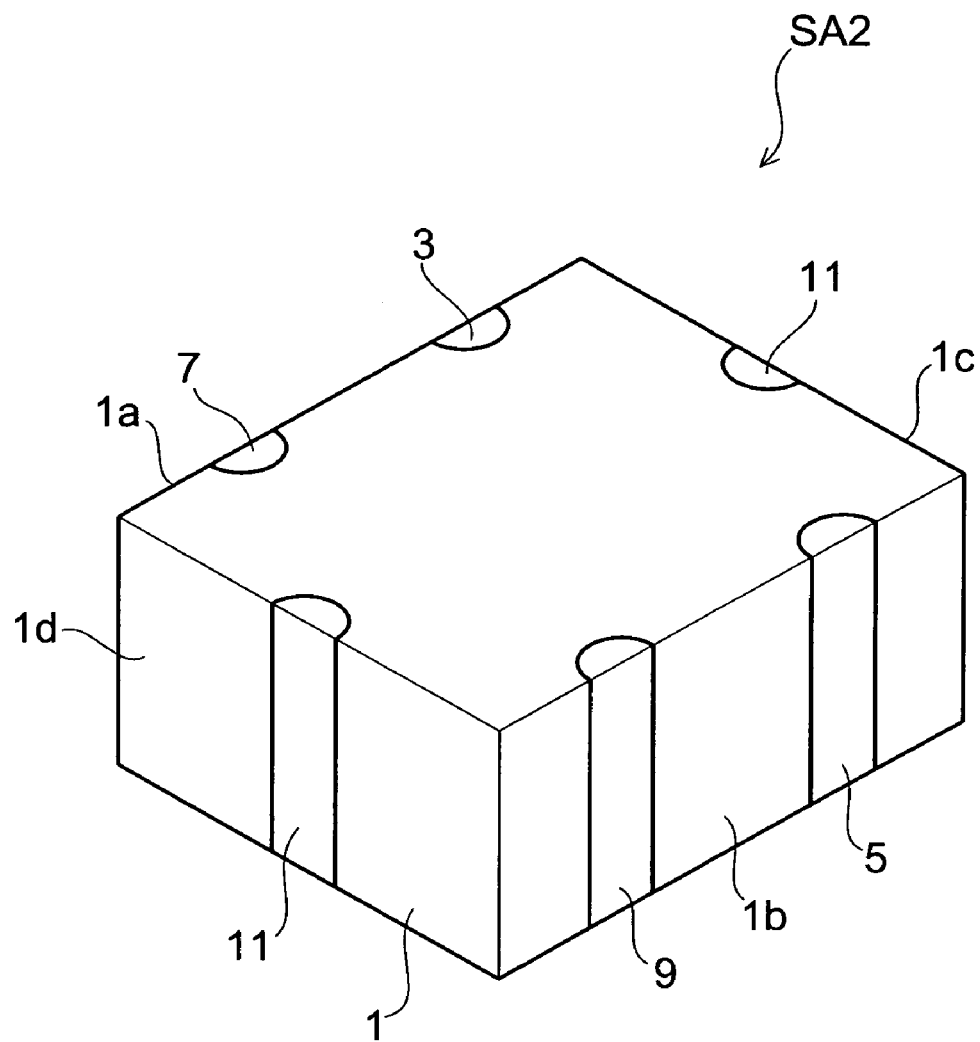
FIG. 7 is a schematic perspective view of a surge absorption element according to a second embodiment.

A surge absorption element SA2 according to the second embodiment will be described next. FIG. 7 is a schematic perspective view of a surge absorption element according to the second embodiment. The circuit constitution of the surge absorption element according to the second embodiment is the same as the circuit constitution of the surge absorption element SA1 according to the first embodiment shown in FIG. 2.

The surge absorption element SA2 according to the second embodiment comprises the body 1, first input terminal 3, second input terminal 7, first output terminal 5, second output terminal 9, and a pair of reference terminals 11, as shown in FIG. 7. The surge absorption element SA2 according to the second embodiment differs from the surge absorption element SA1 according to the first embodiment by virtue of not comprising an external conductor.

The body 1 of the surge absorption element SA2 has a right-angled parallelepiped shape. The length is set at on the order of 1 mm, the width is set at on the order of 0.5 mm, and the height is set at on the order of 0.3 mm, for example. The pair of reference terminals 11 are formed facing the first end face 1c and the second end face 1d of the body 1. The first input terminal 3 and second input terminal 7 are formed on the first side 1a and the first output terminal 5 and second output terminal 9 are formed on the second side 1b facing the first side 1a. The first input terminal 3 and first output terminal 5 are each formed facing one another. Likewise, the second input terminal 7 and second output terminal 9 are also formed facing one another.

Figure 8:
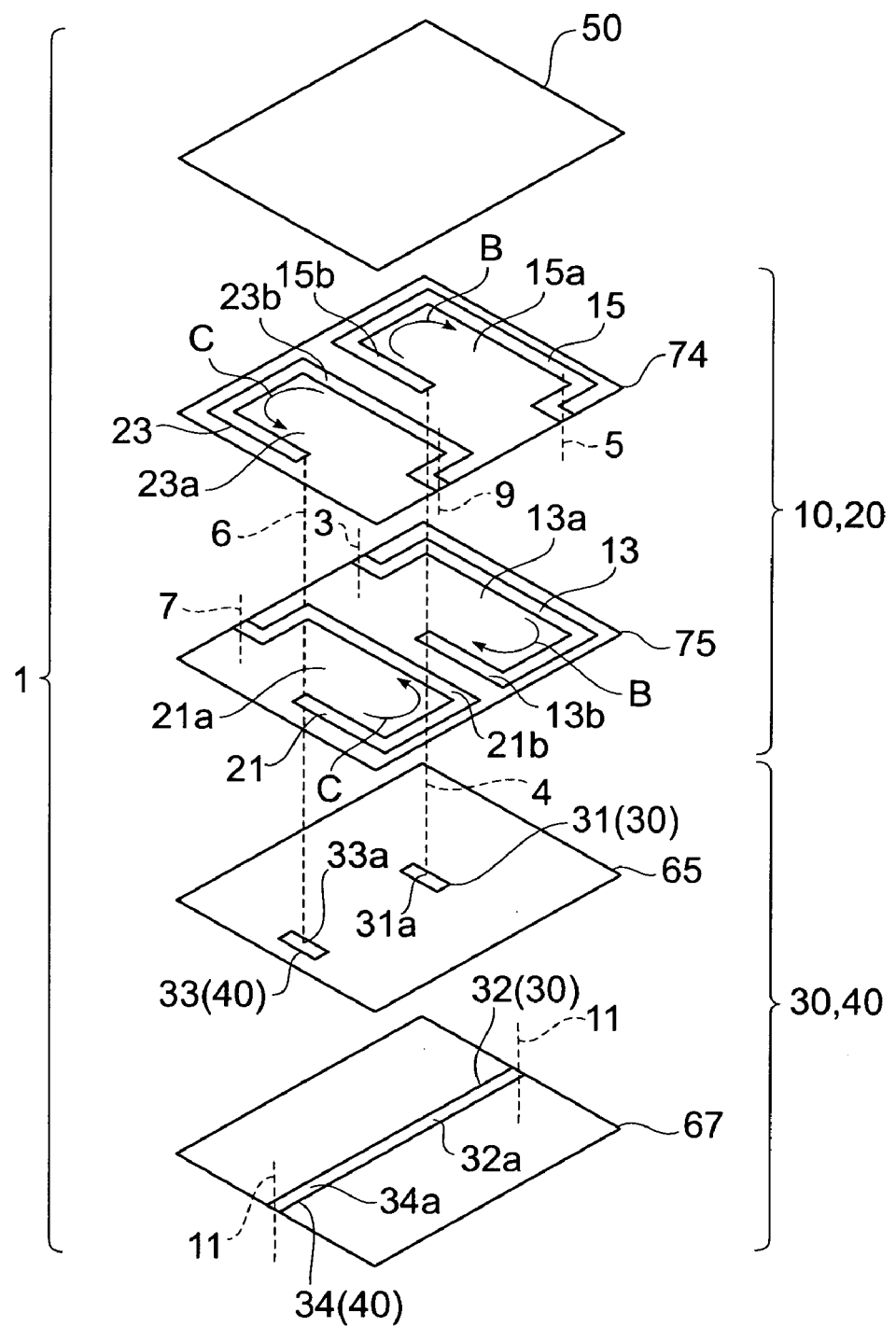
FIG. 8 is an exploded perspective view that serves to illustrate the constitution of the body contained in the surge absorption element according to the second embodiment.

FIG. 8 is an exploded perspective view that serves to illustrate the constitution of the body contained in the surge absorption element according to the second embodiment. The surge absorption element SA2 according to the second embodiment differs form the surge absorption element SA1 according to the first embodiment in that the second coil 15 of the first inductor section 10 and the fourth coil 23 of the second inductor section 20 are both formed on the inductor layer 74 and the first coil 13 of the first inductor section 10 and the third coil 21 of the second inductor section 20 are both formed on the inductor layer 75.

The first coil 13 is extended to one side of the inductor layer 75 so that the one end of the first coil 13 is exposed to the first side 1a of the body 1. The one end of the first coil 13 is connected to the first input terminal 3. One end of the second coil 15 is extended to the one side of the inductor layer 74 so that the one end is exposed to the second side 1b of the body 1. The one end of the second coil 15 is connected to the first output terminal 5. The other end of the first coil 13 and the other end of the second coil 15 are connected via a through-hole conductor 4.

One end of the third coil 21 is extended to one side of the inductor layer 75 so that the one end is exposed to the first side 1a of the body 1. The one end of the third coil 21 is connected to the second input terminal 7. The one end of the fourth coil 23 is extended to the one side of the inductor layer 74 so that the one end is exposed to the second side 1b of the body 1. The one end of the fourth coil 23 is connected to the second output terminal 9. The other end of the third coil 21 and the other end of the fourth coil 23 are connected via a through-hole conductor 6.

In the inductor layers 74 and 75, the internal region 13a of the first coil 13 and the internal region 15a of the second coil 15 mutually overlap when viewed from the coil-stacking direction. The internal region 21a of the third coil 21 and the internal region 23a of the fourth coil 23 also mutually overlap when viewed from the coil-stacking direction. The first coil 13 and third coil 21 comprise parts 13b and 21b respectively that adjoin one another when viewed from the coil-stacking direction. The second coil 15 and fourth coil 23 also comprise parts 15b and 23b that adjoin one another when viewed from the coil-stacking direction.

When a positive-phase signal is input to the first input terminal 3 and an opposite-phase signal is input to the second input terminal 5, a current flows in the first and second coils 13 and 15 in the direction of arrow B when viewed from the coil-stacking direction, that is, in a direction belonging to the clockwise direction. Accordingly, the first and second coils 13 and 15 mutually strengthen the magnetic fields thereof. A current flows in the third and fourth coils 21 and 23 in the direction of arrow C when viewed from the coil-stacking direction, that is, in a direction belonging to the counterclockwise direction. Accordingly, the third and fourth coils 21 and 23 mutually strengthen the magnetic fields thereof.

Because a current flows in the direction of arrow B in the first and second coils 13 and 15 and a current flows in the direction of arrow C in the third and fourth coils 21 and 23, current flows in the same direction in the mutually adjoining parts 13b and 21b of the first coil 13 and third coil 21. Current also flows in the same direction in the mutually adjoining parts 15b and 23b of the second coil 15 and fourth coil 23. Therefore, the magnetic fields are mutually strengthened between the first coil 13 and third coil 15 and the second coil 15 and fourth coil 23. Thus, the first to fourth coils 13, 15, 21, and 23 then possess a positive magnetically coupled state with respect to one another.

The first internal electrode 31 of the first surge absorption section 30 and the third internal electrode 33 of the second surge absorption section 40 are formed on a surge absorption layer 65. The second internal electrode 32 of the first surge absorption section 30 and the fourth internal electrode 34 of the second surge absorption section 40 are formed on the surge absorption layer 67.

The first internal electrode 31 and third internal electrode 33 each have a substantially oblong shape. The first internal electrode 31 is electrically connected via the through-hole conductor 4 to the other end of the first coil 13 and the other end of the second coil 15. The third internal electrode 33 is electrically connected via a through-hole conductor 6 to the other end of the third coil 21 and the other end of the fourth coil 23.

The second internal electrode 32 and fourth internal electrode 34 are integrally formed. The integrally formed second and fourth internal electrodes 32 and 34 have a straight-line pattern that extends in the longitudinal direction of the body 1 and are extended so as to be exposed to the first and second end faces 1c and 1d of the body 1. The second internal electrode 32 and fourth internal electrode 34 are electrically connected to the reference terminal 11.

The first internal electrode 31 and second internal electrode 32 comprise mutually adjoining parts 31a and 32a respectively when viewed from the coil-stacking direction. Therefore, the part of the surge absorption layer 65 interposed between the mutually adjoining parts 31a and 32a functions as a first surge absorption layer. The third internal electrode 33 and fourth internal electrode 34 comprise mutually adjoining parts 33a and 34a respectively when viewed from the coil-stacking direction of the surge absorption layers 65 and 67. Hence, the part of the surge absorption layer 65 interposed between the mutually overlapping parts 33a and 34a functions as a second surge absorption layer.

As described earlier, as per the first embodiment, this second embodiment further comprises first and second inductor sections 30 and 40 in addition to the first and second surge absorption sections 30 and 40. When the first and second surge absorption sections 30 and 40 are working, the first and second inductor sections 10 and 20 are also working. Hence, when the coupling coefficients between the first to fourth coils 13, 15, 21, and 23 and the induction coefficients of the first to fourth coils 13, 15, 21, and 23 have appropriate values, an image impedance Zdin that is independent of frequency can be obtained and the image impedance and characteristic impedance can be matched.

Third Embodiment

Figure 9:
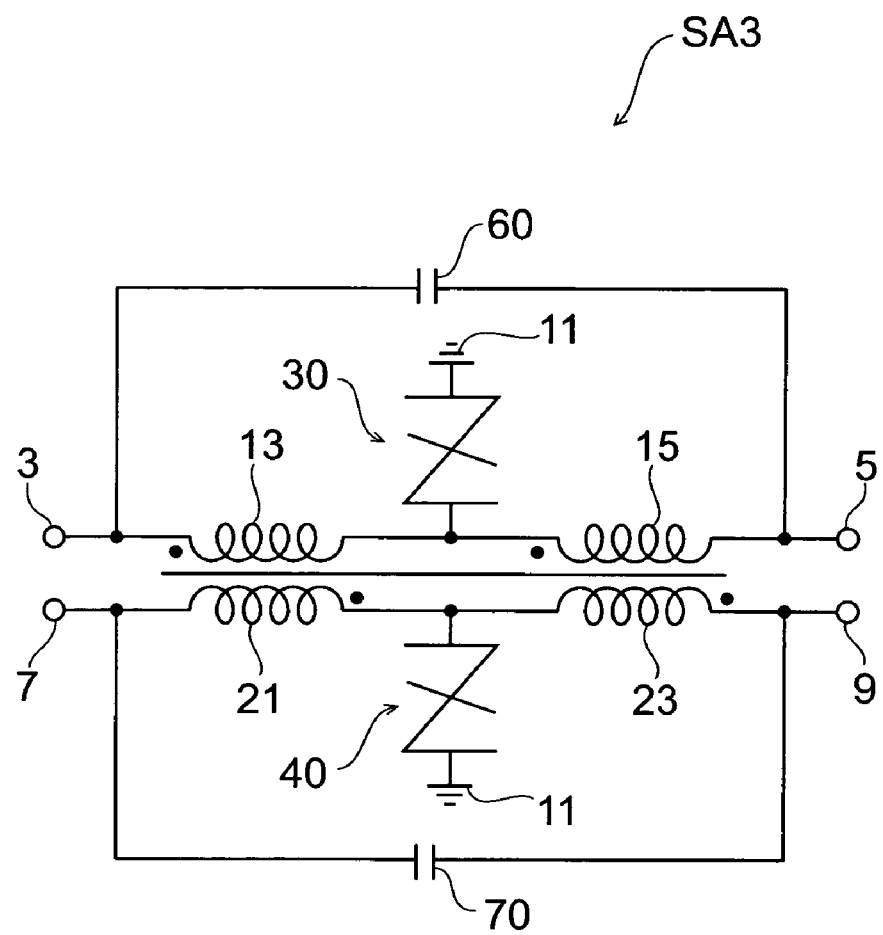
FIG. 9 serves to illustrate the constitution of the circuit of the surge absorption element according to a third embodiment.
Figure 10:
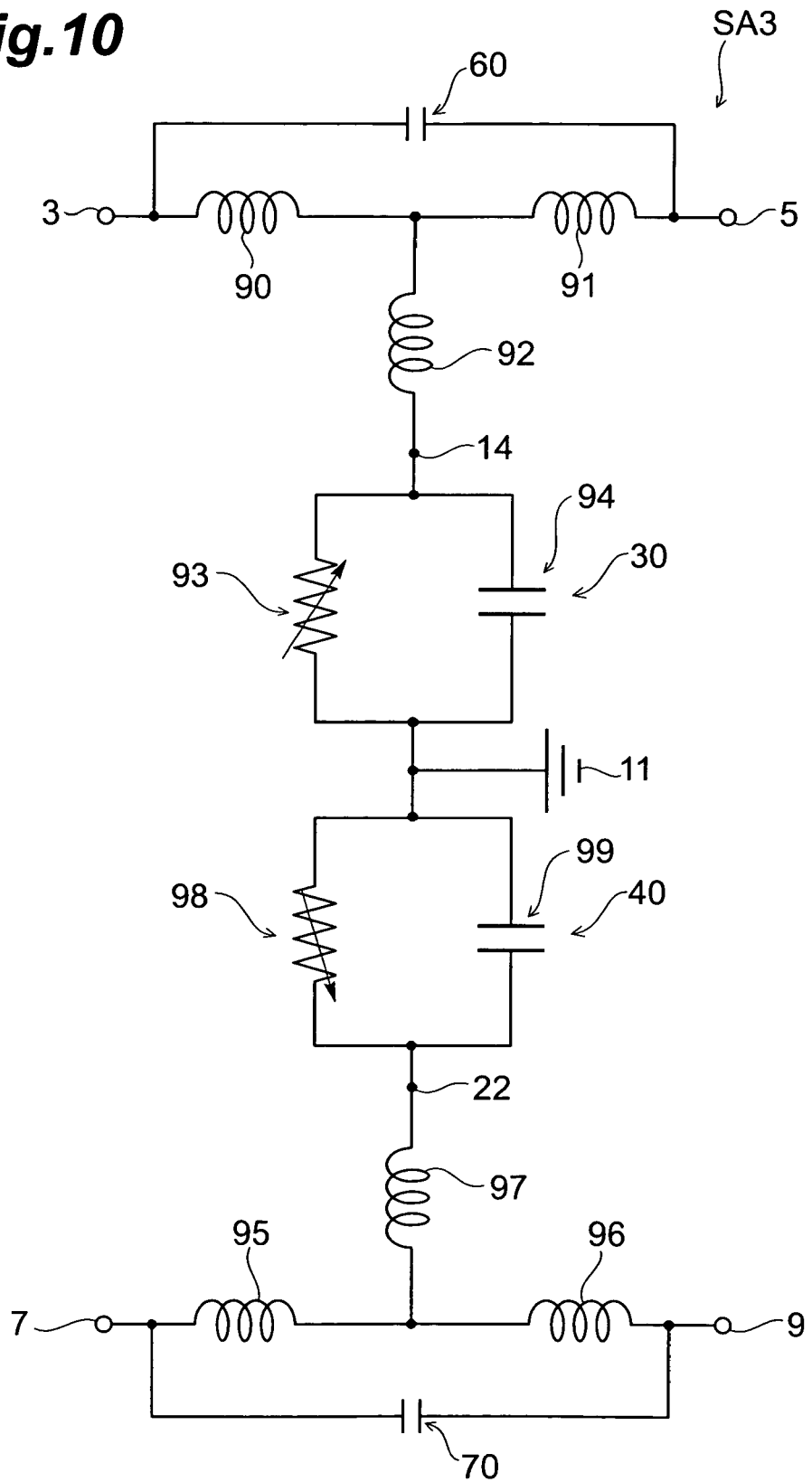
FIG. 10 shows an equivalent circuit of the circuit constitution shown in FIG. 9.

The surge absorption element according to the third embodiment will be described next. FIG. 9 serves to illustrate the constitution of the circuit of the surge absorption element (surge absorption circuit) according to the third embodiment. FIG. 10 shows an equivalent circuit of the circuit constitution shown in FIG. 9. The circuit constitution of a surge absorption element SA3 according to the third embodiment differs from the circuit constitution of the surge absorption element SA1 according to the first embodiment shown in FIG. 2 and the surge absorption element SA2 according to the second embodiment by virtue of comprising a first capacitor 60 and a second capacitor 70.

As shown in FIGS. 9 and 10, the first capacitor 60 is interposed between the first input terminal 3 and first output terminal 5. One end of the first capacitor 60 is connected to the first input terminal 3 and the other end is connected to the first output terminal 5. The second capacitor 70 is interposed between the second input terminal 7 and second output terminal 9. One end of the second capacitor 70 is connected to the second input terminal 7 and the other end is connected to the first output terminal 9.

The image impedance Zdin of the surge absorption element SA3 shown in FIG. 9 is expressed by Equation (6) below. Here, the capacitance of the first and second capacitors 60 and 70 is Cs in each case.

Equation 6

$$Zdin = \sqrt{\frac{8(1+Kz+Kc)Lz}{Cz} \cdot \frac{1-\frac{1}{2}\omega^2 LzCz(1-Kz+Kc)}{1-2\omega^2 LzCs(1+Kz+Kc)}} \quad (6)$$

In Equation (6), if the capacitance Cs of the first and second capacitors 60 and 70 is established to satisfy Equation (7) below, the image impedance Zdin no longer depends on the frequency. If the inductance coefficient Lz of each of the internal conductors is set as shown in Equation (8) below after setting the capacitance Cs of the first and second capacitors 60 and 70 in Equation (7) below, the image impedance Zdin and characteristic impedance Zdo can be matched.

Equation 7

$$Cs = \frac{Cz(1 - Kz + Kc)}{4(1 + Kz + Kc)} \qquad (7)$$

Equation 8

$$Lz = \frac{Z_{d0}^2 Cz}{8(1 + Kz + Kc)} \qquad (8)$$

As can be seen from Equations (7) and (8) above, because the coupling coefficient Kz is chosen arbitrarily, highly flexible circuit design is possible.

Further, in order to apply the surge absorption element SA3 to a circuit that handles high-speed signals, the effect of the stray inductance components 62 and 67 of the first and second surge absorption sections 30 and 40 shown in FIG. 4 as well as that of the stray capacitance components 94 and 99 shown in FIG. 10 is preferably also small. When third inductance components 92 and 97 with a negative inductance coefficient are used, as can also be seen from the equivalent circuit shown in FIG. 10, the stray inductance components 62 and 67 of the first and second surge absorption sections 30 and 40 can be canceled but are apparently the same as the state where the magnetic coupling is reduced. Hence, the capacitance Cs of the first and second capacitors 60 and 70 preferably satisfies Equation (9) below when the coupling coefficients Kz and Kc and the inductance coefficient Lz stay the same.

Equation 9

$$Cs = \frac{1 - Kz + Kc + 2\frac{Le}{Lz}}{4(1 + Kz + Kc)} Cz \qquad (9)$$

where KzLz≧Le. With such a design, even when the surge absorption element SA3 contains stray capacitance components 94 and 99 and stray inductance components 62 and 67, the image impedance Zdin can be reliably matched with the characteristic impedance Zdo.

Figure 11:
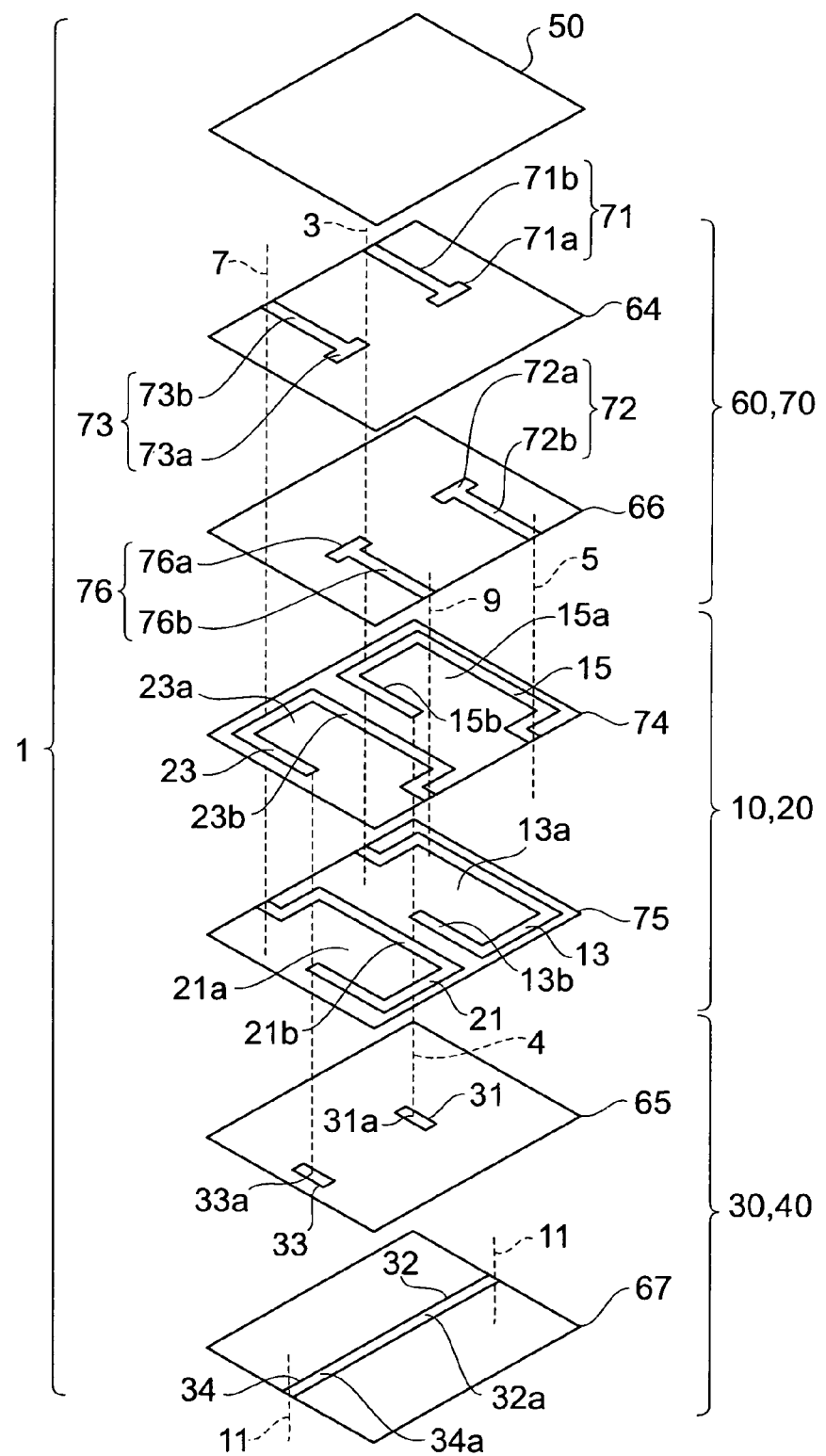
FIG. 11 is an exploded perspective view that serves to illustrate the constitution of the body contained in the surge absorption element according to the third embodiment.

The constitution of the body contained in the surge absorption element according to the third embodiment will be described next. FIG. 11 is an exploded perspective view that serves to illustrate the constitution of the body contained in the surge absorption element according to the third embodiment. The surge absorption element SA3 according to the third embodiment differs from the surge absorption element SA2 according to the second embodiment by virtue of comprising the first capacitor 60 and second capacitor 70.

The surge absorption element SA3 of the third embodiment comprises, like the surge absorption element SA2 shown in FIG. 7, the body 1, first input terminal 3, first output terminal 5, second input terminal 7, second output terminal 9, and reference terminal 11. The body 1 has a structure in which, as shown in FIG. 11, first and second surge absorption section 30 and 40, first and second inductor sections 10 and 20, first and second capacitors 60 and 70, and protective layer 50 are sequentially stacked starting from below. The constitution of the first and second surge absorption sections 30 and 40, the first and second inductor sections 10 and 20, and the protective layer 50 is the same as that of the surge absorption element SA2 according to the second embodiment.

The first capacitor 60 comprises a fifth internal electrode 71 that is connected to the first input terminal 3, a sixth internal electrode 72 connected to the first output terminal 5, and a first insulation layer that is interposed between the fifth internal electrode 71 and sixth internal electrode 72. The fifth internal electrode 71 is formed on the insulator layer 64 and the sixth internal electrode 72 is formed on an insulator layer 66. In the insulator layer 64, the part that is interposed between the fifth internal electrode 71 and sixth internal electrode 72 is the first insulation layer.

The fifth internal electrode 71 comprises a first electrode part 71a and a second electrode part 71b. The first electrode part 71a has a substantially rectangular shape. The second electrode part 71b is extended from the first electrode part 71a such that the second electrode part 71b is exposed to the first side 1a of the body 1 and connected to the first input terminal 3. The first electrode part 71a is electrically connected to the first input terminal 3 via the second electrode part 71b. The first electrode part 71a and second electrode part 71b are integrally formed.

The sixth internal electrode 72 comprises a first electrode part 72a and a second electrode part 72b. The first electrode part 72a mutually overlaps the first electrode part 71a of the fifth internal electrode 71 when viewed from the stacking direction of the insulator layers 64 and 66. The first electrode part 72a has a substantially rectangular shape. The second electrode part 72b is extended from the first electrode part 72a so that the second electrode part 72b is exposed to the second side 1b of the body 1 and connected to the first output terminal 5. The first electrode part 72a is electrically connected to the first output terminal 5 via the second electrode part 72b. The first electrode part 72a and second electrode part 72b are integrally formed.

The second capacitor 70 comprises a seventh internal electrode 73 that is connected to the second input terminal 7, an eighth internal electrode 76 connected to the second output terminal 9, and a second insulation layer that is interposed between the seventh internal electrode 73 and eighth internal electrode 76. The seventh internal electrode 73 is formed on the insulator layer 64 and the eighth internal electrode 76 is formed on the insulator layer 66. In the insulator layer 64, the part that is interposed between the seventh internal electrode 73 and eighth internal electrode 76 is the second insulation layer.

The seventh internal electrode 73 comprises a first electrode part 73a and a second electrode part 73b. The first electrode part 73a mutually overlaps the first electrode part 76a of the eighth internal electrode 76 (described subsequently) when viewed from the stacking direction of the insulator layers 64 and 66. The first electrode part 73a has a substantially rectangular shape. The second electrode part 73b is extended from the first electrode part 73a so that the second electrode part 73b is exposed to the first side 1a of the body 1 and connected to the second input terminal 7. The first electrode part 73a is electrically connected to the second input terminal 7 via the second electrode part 73b. The first electrode part 73a and second electrode part 73b are integrally formed.

The eighth internal electrode 76 comprises a first electrode part 76a and a second electrode part 76b. The first electrode part 76a mutually overlaps the first electrode part 73a of the seventh internal electrode 73 when viewed from the stacking direction of the insulator layers 64 and 66. The first electrode part 76a has a substantially rectangular shape. The second electrode part 76b is extended from the first electrode part 76a so that the second electrode part 76b is exposed to the second side 1b of the body 1 and connected to the second output terminal 9. The first electrode part 76a is electrically connected to the second output terminal 9 via the second electrode part 76b. The first electrode part 76a and second electrode part 76b are integrally formed.

The insulator layers 64 and 66 are layers each made of a ceramic material. The material constituting the insulator layers 64 and 66 is not especially restricted and a variety of ceramic materials can be applied. However, from the perspective of reducing detachment, a material that comprises ZnO as the principal component as per the inductor layers 74 and 75 is preferable.

As described above, this third embodiment comprises first and second capacitors 60 and 70 in addition to the first and second surge absorption sections 30 and 40 and the first and second inductor sections 10 and 20. When the first and second surge absorption sections 30 and 40 are working, the first and second inductor sections 10 and 20 and the first and second capacitors 60 and 70 are working. The first and second capacitors 60 and 70 act in the same way as the magnetic coupling of the first coil 13 and second coil 15 and the magnetic coupling of the third coil 21 and fourth coil 23. Hence, when the capacitance values of the first and second capacitors 60 and 70 have suitable values, the coupling coefficient between the first to fourth coils 13, 15, 21, and 23 can be flexibly changed.

Further, because the first to fourth coils 13, 15, 21, and 23 have a positive magnetically coupled state with respect to one another, the length of the first to fourth coils 13, 15, 21, and 23 can be shortened when the first to fourth coils 13, 15, 21, and 23 are not afforded a positive magnetic coupling.

Further, because the first and second capacitors 60 and 70 can be formed by stacking the fifth to eighth internal electrodes 71, 72, 73, and 76 and the insulator layer 64, formation is straightforward.

Fourth Embodiment

Figure 12:
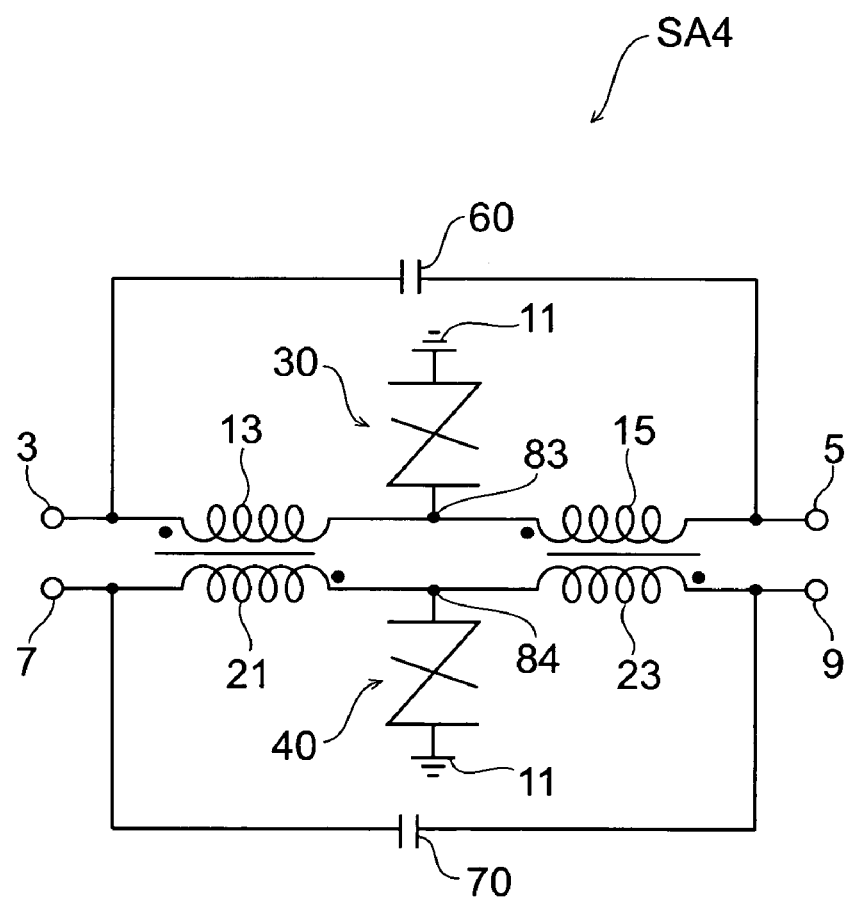
FIG. 12 serves to illustrate the constitution of the circuit of the surge absorption element according to a fourth embodiment.

The surge absorption element according to the fourth embodiment will be described next. FIG. 12 serves to illustrate the constitution of the circuit of the surge absorption element (surge absorption circuit) according to the fourth embodiment.

In the surge absorption element SA4 according to the fourth embodiment, the magnetic fields produced between the first coil 13 and second coil 15 and between the third coil 21 and fourth coil 23 do not readily influence one another. That is, the magnetic coupling between the first coil 13 and second coil 15 and between the third coil 21 and fourth coil 23 is extremely small and there is substantially no effect on the mutual characteristic between the two coils. The coupling coefficients between the first coil 13 and second coil 15 and between the third coil 21 and fourth coil 23 are not especially restricted unless the coupling coefficients affect one another and are preferably no more than 0.01.

In this circuit, the coupling coefficient Kz in Equation (6) above can be seen as being substantially zero. Accordingly, the image impedance Zdin of the surge absorption element SA4 is expressed by Equation (10) below.

Equation 10

$$Zdin = \sqrt{\frac{8(1+Kc)Lz}{Cz} \cdot \frac{1 - \frac{1}{2}\omega^2 LzCz(1+Kc)}{1 - 2\omega^2 LzCs(1+Kc)}} \quad (10)$$

In Equation (10) above, if the capacitance Cs of the first and second capacitors 60 and 70 is set to satisfy Equation (11) below, the image impedance Zdin no longer depends on the frequency. If the induction coefficient Lz of the respective internal conductors is set as shown in Equation (12) below after setting the capacitance Cs of the first and second capacitors 60 and 70 in Equation (11) below, the image impedance Zdin can be matched with the impedance Zdo.

Equation 11

$$Cs = \frac{Cz}{4} \quad (11)$$

Equation 12

$$Lz = \frac{Z_{d0}^2 Cz}{8(1+Kc)} \quad (12)$$

Figure 13:
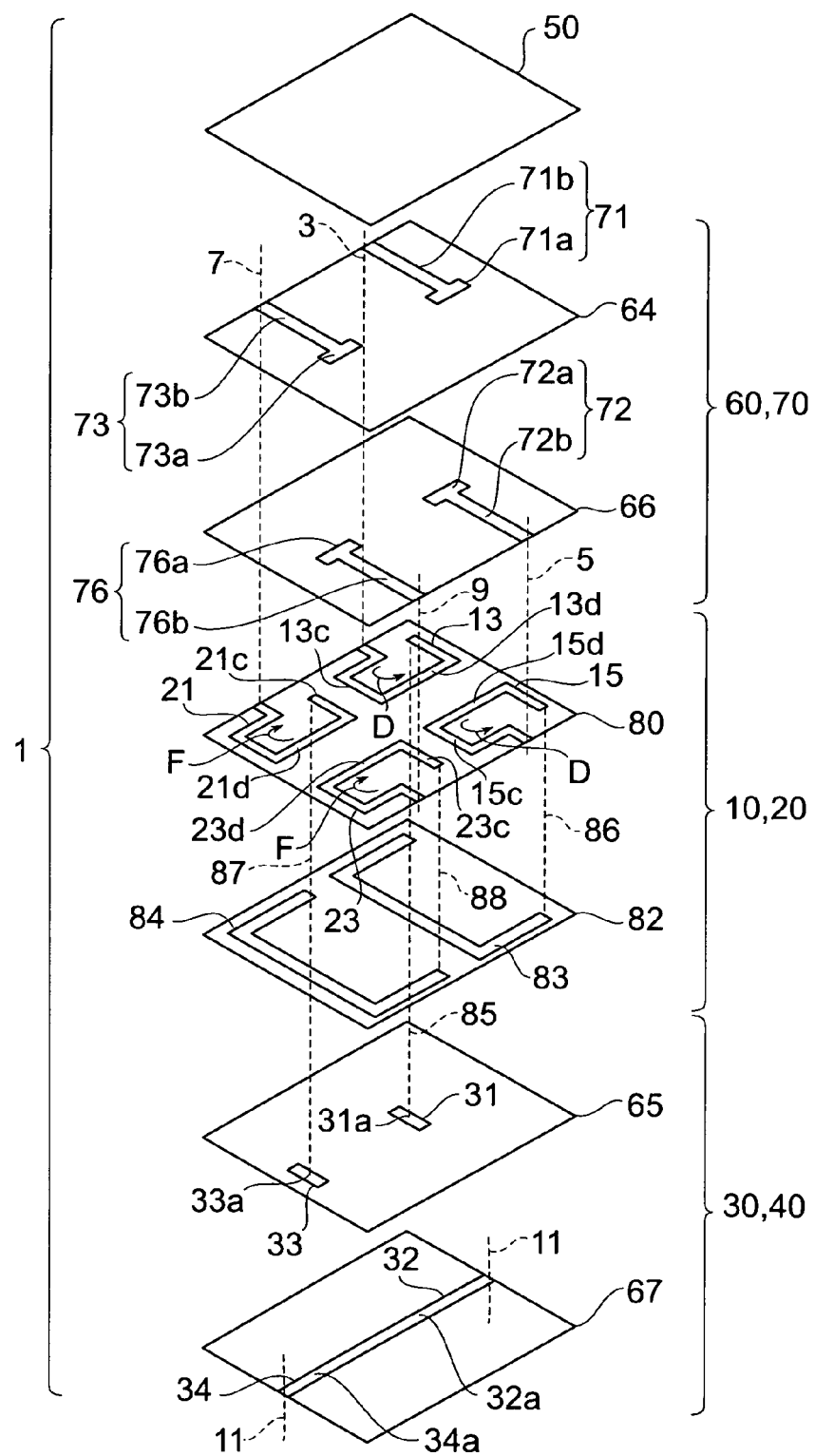
FIG. 13 is an exploded perspective view that serves to illustrate the constitution of the body contained in the surge absorption element according to the fourth embodiment.

The constitution of the surge absorption element according to the fourth embodiment will be described next based on FIG. 13. FIG. 13 is an exploded perspective view that serves to illustrate the constitution of the body contained in the surge absorption element according to the fourth embodiment. The surge absorption element according to the fourth embodiment differs from the surge absorption element SA3 according to the third embodiment with respect to the constitution of the first inductor section 10 and the second inductor section 20.

The surge absorption element SA4 according to the fourth embodiment comprises the body 1, first input terminal 3, first output terminal 5, second input terminal 7, second output terminal 9, and reference terminal 11 as per the surge absorption element SA2 shown in FIG. 7.

The constitution is such that the first to fourth coils 13, 15, 21, and 23 are formed on the inductor layer 80 as shown in FIG. 13 and the inductor layer 80 and inductor layer 82 are stacked. An internal conductor 83 that connects the first coil 13 and second coil 15 and an internal conductor 84 that connects the third coil 21 and fourth coil 23 are formed on the inductor layer 82.

One end of the first coil 13 is extended so that the one end is exposed to the first side 1a and connected to the first input terminal 3. The other end of the first coil 13 is connected via a through-hole 85 to one end of the internal conductor 83 formed on the inductor layer 82. One end of the second coil 15 is extended so that the one end is exposed to the second side 1b and connected to the first output terminal 5. The other end of the second coil 15 is connected via a through-hole conductor 86 to the other end of the internal conductor 83 formed on the inductor layer 82.

One end of the third coil 21 is extended so that the one end is exposed to the first side 1a and connected to the second input terminal 7. The other end of the third coil 21 is connected via a through-hole conductor 87 to one end of the internal conductor 84 formed on the inductor layer 82. One end of the fourth coil 23 is extended so that the one end is exposed to the second side 1b and connected to the second output terminal 9. The other end of the fourth coil 23 is connected via a through-hole conductor 88 to the other end of the internal conductor 84 formed on the inductor layer 82.

The first coil 13 and third coil 21 comprise parts 13c and 21c respectively that mutually adjoin one another when viewed from the coil-stacking direction. The second coil 15 and fourth coil 23 comprise parts 15c and 23c respectively that mutually adjoin one another when viewed from the coil-stacking direction. The first coil 13 and second coil 15 comprise parts 13d and 15d respectively that mutually adjoin one another when viewed from the coil-stacking direction. The distance between the adjoining parts 13d and 15d is long in comparison with the distance between the adjoining parts 13c and 21c. The third coil 21 and fourth coil 23 comprise parts 21d and 23d that mutually adjoin one another when viewed from above the body 1. The distance between the adjoining parts 21d and 23d is long in comparison with the distance between the adjoining parts 15c and 23c.

A case where a positive-phase signal is input to the first input terminal 3 of the surge absorption element SA4 that comprises this body 1 and an opposite-phase signal is input to the second input terminal 5 thereof may be considered. As shown in FIG. 13, current flows in the first and second coils 13 and 15 in the direction of arrow D, that is, a direction that belongs to the counterclockwise direction, when viewed from the coil-stacking direction. Current flows in the third and fourth coils 21 and 23 in the direction of arrow F, that is, a direction that belongs to the clockwise direction, when viewed from the coil-stacking direction. Hence, current flows in the same direction in the mutually adjoining parts 13c and 21c of the first coil 13 and third coil 21. Current also flows in the same direction in the mutually adjoining parts 15c and 23c of the second coil 15 and fourth coil 23. Therefore, the first coil 13 and third coil 21 and the second coil 15 and fourth coil 23 possess a positive magnetically coupled state with respect to one another.

The orientations of the currents flowing in the mutually adjoining parts 13d and 15d of the first and second coils 13 and 15 are the reverse of one another. Further, the orientations of the currents flowing in the mutually adjoining parts 21d and 23d of the third and fourth coils 21 and 23 are the reverse of one another. So to in a case where currents of opposite orientation are flowing, the distances between the adjoining parts 13d and 15d and the adjoining parts 21d and 23d are such that the parts are spaced apart, and therefore the magnetic fields produced between the first and second coils 13 and 15 and between the third and fourth coils 21 and 23 do not readily affect one another. That is, the first coil 13 and second coil 15 and the third coil 21 and fourth coil 23 are not afforded a magnetically coupled state.

As mentioned earlier, this fourth embodiment comprises first and second inductor sections 10 and 20 and first and second capacitors 60 and 70 in addition to the first and second surge absorption sections 30 and 40. When the first and second surge absorption sections 30 and 40 are working, first and second inductor sections 10 and 20 and first and second capacitors 60 and 70 are also working. The first and second capacitors 60 and 70 act in the same way as the magnetic coupling of the first coil 13 and second coil 15 and the magnetic coupling of the third coil 21 and fourth coil 23. Hence, even when there is almost no magnetic coupling produced between the first coil 13 and second coil 15 and the third coil 21 and fourth coil 23, in cases where the capacitance values of the first and second capacitors 60 and 70 are suitable values, an image impedance that is not dependent on the frequency can be obtained. Further, the image impedance and characteristic impedance of the surge absorption element can be matched by canceling the effect of the stray capacitance components of the first and second surge absorption sections 30 and 40 by suitably setting the capacitance values of the second capacitors 60 and 70 and the induction coefficients of the first to fourth coils 13, 15, 21, and 23.

Further, the constitution is such that the first and third coils 13 and 21 have a positive magnetically coupled state with respect to one another and the second and fourth coils 15 and 23 have a positive magnetically coupled state with respect to one another. Hence, the induction coefficient of the first to fourth coils 13, 15, 21, and 23 can be made small in comparison with the induction coefficient when the first to fourth coils 13, 15, 21, and 23 are not afforded a positive magnetically coupled state with respect to one another. The length of the first to fourth coils 13, 15, 21, and 23 can be shortened accordingly. As a result, miniaturization of the surge absorption element can be achieved.

Although the preferred embodiments of the present invention were described hereinabove, the present invention is not necessarily limited to the above embodiments. A variety of modifications are possible within a scope that does not depart from the spirit of the invention.

As long as the equivalent circuit mentioned earlier or a circuit with the same functions as the equivalent circuit can be constituted, the stacked structure and the electrode formation position and so forth of the surge absorption element of the present invention can be optionally changed. That is, the positional relationship of the first and second input terminals 3 and 7, the first and second output terminals 5 and 9, the reference terminal 11, and the first and second external conductors 14 and 22 may be optionally changed.

In this embodiment, the first and second surge absorption sections 30 and 40 are varistors but are not limited to varistors. The first and second surge absorption sections may employ a PN junction (a Zener diode or silicon surge damper or the like, for example) and a gap discharge element or the like.

The numbers of each of the stacked layers, namely, the inductor layers, varistor layers, insulator layers, and protective layers are not necessarily restricted to those of the above embodiments. That is, by repeatedly stacking inductor layers in which internal conductors are formed, for example, the number of turns of the coil pattern may be increased further. A varistor layer in which an internal electrode is formed may be repeatedly stacked. The numbers of stacked layers can be suitably adjusted to suit the desired characteristics of the surge absorption element.

Further, when the internal conductors of the first and second inductor sections 10 and 20 of the surge absorption element are stacked, in cases where the material constituting the inductor layer has a high permittivity, the internal conductors that adjoin one another in the stacking direction are coupled and a parasitic capacitance is produced between the internal conductors. Hence, application to high-frequency applications tends to be especially difficult when the first and second inductor sections 10 and 20 have a constitution in which internal conductors are stacked. From this perspective, the inductor layers preferably has a lower permittivity and, more specifically, preferably has a relative permittivity of no more than 50.

Further, in this embodiment, although a case has been described where the first capacitor 60 is formed by the fifth internal electrode 71 and sixth internal electrode 72 and the second capacitor 70 is formed by the seventh internal electrode 73 and eighth internal electrode 76, as shown in FIGS. 11 and 13, this embodiment is not necessarily limited to this constitution. For example, the first and second capacitors may be formed by using the interconductor capacitance of the conductors forming the first inductor section and second inductor section. In short, as shown in FIGS. 9 and 12, circuitwise, the first capacitor 60 may be formed between the first input terminal 3 and first output terminal 5 and the second capacitor 70 may be formed between the second input terminal 7 and second output terminal 9.

What is claimed is:

1. A surge absorption element, comprising:
    an inductor section that comprises a first coil one end of which is connected to a first input terminal; a second coil one end of which is connected to a first output terminal and the other end of which is connected to the other end of the first coil; a third coil one end of which is connected to a second input terminal; and a fourth coil one end of which is connected to a second output terminal and the other end of which is connected to the other end of the third coil;
    a first surge absorption section that comprises a first internal electrode that is connected to a first interconnect between the first coil and the second coil of the inductor section; a second internal electrode that faces the first internal electrode and is connected to a reference terminal; and a first surge absorption layer that is interposed between the first internal electrode and the second internal electrode; and
    a second surge absorption section that comprises a third internal electrode that is connected to a second interconnect between the third coil and the fourth coil of the inductor section; a fourth internal electrode that faces the third internal electrode and is connected to the reference terminal; and a second surge absorption layer that is interposed between the third internal electrode and the fourth internal electrode,
    wherein the surge absorption element is constituted such that, when opposite-phase signals are applied to the first and second input terminals, the first, second, third, and fourth coils are in a positive magnetically coupled state with respect to one another, so as to mutually strengthen magnetic fields thereof, and
    wherein coupling coefficients induced by the first, second, third and fourth coils are established so that image impedance of the surge absorption element is independent of a frequency of the applied opposite-phase signals.

2. The surge absorption element according to claim 1, wherein the first surge absorption layer is made of a semiconductor ceramic and the second surge absorption layer is made of a semiconductor ceramic.

3. The surge absorption element according to claim 1, wherein the inductor section comprises:
    a first insulation layer that is interposed between the first and second coils;
    a second insulation layer that is interposed between the second and third coils; and
    a third insulation layer that is interposed between the third and fourth coils; and
    the first, second, third, and fourth coils are arranged such that, when opposite-phase signals are applied to the first and second input terminals, the orientation of the magnetic fields produced in the first, second, third, and fourth coils is the same orientation and arranged such that at least a portion of a region in the first coil, a region in the second coil, a region in the third coil, and a region in the fourth coil overlaps when viewed from the coil-stacking direction.

4. The surge absorption element according to claim 3, wherein the first surge absorption layer, second surge absorption layer, first insulation layer, second insulation layer, and third insulation layer constitute a rectangular parallelepiped body overall;
    the first and second input terminals are formed on a first side of the body; and
    the first and second output terminals are formed on a second side of the body.

5. The surge absorption element according to claim 4, wherein the first and second sides face one another.

6. The surge absorption element according to claim 4, wherein the other end of the first coil is exposed on the outer surface of the body; the other end of the second coil is exposed on the outer surface of the body;
    the exposed sections of the first and second coils are connected via a first external conductor formed on the outer surface of the body;
    the other end of the third coil is exposed on the outer surface of the body; the other end of the fourth coil is exposed on the outer surface of the body; and
    the exposed sections of the third and fourth coils are connected via a second external conductor formed on the outer surface of the body.

7. The surge absorption element according to claim 4, wherein the reference terminal is formed on the outer surface of the body and disposed between the first and second input terminals or between the first and second output terminals.

8. The surge absorption element according to claim 1, further comprising:
    a first capacitor that is interposed between the first input terminal and the first output terminal; and
    a second capacitor that is interposed between the second input terminal and the second output terminal.

9. The surge absorption element according to claim 8, wherein the first capacitor comprises:
    a fifth internal electrode that is connected to the first input terminal;
    a sixth internal electrode that is connected to the first output terminal; and
    an insulation layer that is interposed between the fifth and sixth internal electrodes; and
    the second capacitor comprises:
    a seventh internal electrode that is connected to the second input terminal;
    an eighth internal electrode that is connected to the second output terminal; and
    an insulation layer that is interposed between the seventh and eighth internal electrodes.

10. The surge absorption element according to claim 1, wherein
    the coupling coefficients include a first and second coupling coefficients, the first coupling coefficient being between the first and second coils and between the third and forth coils, the second coupling coefficient being between the first and third coils and between the second and forth coils, and
    the first and second coupling coefficients satisfy a following formula (A):

$$Kz - Kc = 1 \quad (A),$$

where the Kz is the first coupling coefficient and the Kc is the second coupling coefficient.

11. The surge absorption element according to claim 8, wherein
    the first and second capacitor satisfy a following formula (B):

$$Cs = \frac{Cz(1 - Kz + Kc)}{4(1 + Kz + Kc)}, \quad \text{(B)}$$

where the Cs is capacitances of the first and second capacitors, the Cz is stray capacitances of the first and second surge absorption sections, the Kz is a first coupling coefficient and the Kc is a second coupling coefficient, and the first coupling coefficient is one of the coupling coefficients and is between the first and second coils and between the third and forth coils, and the second coupling coefficient is one of the coupling coefficients and is between the first and third coils and between the second and forth coils.

12. A surge absorption element, comprising:

an inductor section that comprises a first coil one end of which is connected to a first input terminal; a second coil one end of which is connected to a first output terminal and the other end of which is connected to the other end of the first coil; a third coil one end of which is connected to a second input terminal; and a fourth coil one end of which is connected to a second output terminal and the other end of which is connected to the other end of the third coil;

a first surge absorption section that comprises a first internal electrode that is connected to a first interconnect between the first coil and the second coil of the inductor section; a second internal electrode that faces the first internal electrode and is connected to a reference terminal; and a first surge absorption layer that is interposed between the first internal electrode and the second internal electrode;

a second surge absorption section that comprises a third internal electrode that is connected to a second interconnect between the third coil and the fourth coil of the inductor section; a fourth internal electrode that faces the third internal electrode and is connected to the reference terminal; and a second surge absorption layer that is interposed between the third internal electrode and the fourth internal electrode;

a first capacitor that is interposed between the first input terminal and the first output terminal; and a second capacitor that is interposed between the second input terminal and the second output terminal, wherein the surge absorption element is constituted such that, when opposite-phase signals are applied to the first and second input terminals, the first coil and the third coil are in a positive magnetically coupled state with respect to one another, so as to mutually strengthen magnetic fields thereof, and the second coil and the fourth coil are in a positive magnetically coupled state with respect to one another, so as to mutually strengthen magnetic fields thereof, and wherein capacitances of the first and second capacitors are established so that image impedance of the surge absorption element is independent of a frequency of the applied opposite-phase signals.

13. The surge absorption element according to claim 12, wherein the first and second capacitors satisfy a following formula (C):

$$Cs = \frac{Cz}{4}, \quad \text{(C)}$$

where the Cs is capacitances of the first and second capacitors, and the Cz is stray capacitances of the first and second surge absorption sections.

14. A surge absorption circuit, comprising:

a first coil one end of which is connected to a first input terminal;

a second coil one end of which is connected to a first output terminal and the other end of which is connected to the other end of the first coil;

a third coil one end of which is connected to a second input terminal; and a fourth coil one end of which is connected to a second output terminal and the other end of which is connected to the other end of the third coil;

a first surge absorption section one end of which is connected to a first interconnect between the first and second coils and the other end of which is connected to a reference terminal; and a second surge absorption section one end of which is connected to a second interconnect between the third and fourth coils and the other end of which is connected to the reference terminal, wherein the surge absorption circuit is constituted such that, when opposite-phase signals are applied to the first and second input terminals, the first, second, third, and fourth coils are in a positive magnetically coupled state with respect to one another, so as to mutually strengthen magnetic fields thereof, and wherein coupling coefficients induced by the first, second, third and fourth coils are established so that image impedance of the surge absorption element is independent of a frequency of the applied opposite-phase signals.

15. The surge absorption circuit according to claim 14, further comprising:

a first capacitor one end of which is connected to the first input terminal and the other end of which is connected to the first output terminal; and a second capacitor one end of which is connected to the second input terminal and the other end of which is connected to the second output terminal.

16. The surge absorption circuit according to claim 14, wherein the coupling coefficients include a first and second coupling coefficients, the first coupling coefficient being between the first and second coils and between the third and forth coils, the second coupling coefficient being between the first and third coils and between the second and forth coils, and the first and second coupling coefficients satisfy a following formula (A):

$$Kz - Kc = 1 \quad \text{(A)},$$

where the Kz is the first coupling coefficient and the Kc is the second coupling coefficient.

17. The surge absorption circuit according to claim 15, wherein the first and second capacitor satisfy a following formula (B):

$$Cs = \frac{Cz(1 - Kz + Kc)}{4(1 + Kz + Kc)}, \quad \text{(B)}$$

where the Cs is capacitances of the first and second capacitors, the Cz is stray capacitances of the first and second surge absorption sections, the Kz is a first coupling coefficient and the Kc is a second coupling coefficient, and the first coupling coefficient is one of the coupling coefficients and is between the first and second coils and between the third and forth coils, and the second coupling coefficient is one of the coupling coefficients and is between the first and third coils and between the second and forth coils.

18. A surge absorption circuit, comprising:
- a first coil one end of which is connected to a first input terminal;
- a second coil one end of which is connected to a first output terminal and the other end of which is connected to the other end of the first coil;
- a third coil one end of which is connected to a second input terminal;
- a fourth coil one end of which is connected to a second output terminal and the other end of which is connected to the other end of the third coil;
- a first surge absorption section one end of which is connected to a first interconnect between the first and second coils and the other end of which is connected to a reference terminal;
- a second surge absorption section one end of which is connected to a second interconnect between the third and fourth coils and the other end of which is connected to the reference terminal;
- a first capacitor one end of which is connected to the first input terminal and the other end of which is connected to the first output terminal; and
- a second capacitor one end of which is connected to the second input terminal and the other end of which is connected to the second output terminal, wherein the surge absorption circuit is constituted such that, when opposite-phase signals are applied to the first and second input terminals, the first coil and the third coil are in a positive magnetically coupled state with respect to one another, so as to mutually strengthen magnetic fields thereof, and the second coil and the fourth coil are in the positive magnetically coupled state with respect to one another, so as to mutually strengthen magnetic fields thereof, and wherein capacitances of the first and second capacitors are established so that image impedance of the surge absorption element is independent of a frequency of the applied opposite-phase signals.

19. The surge absorption circuit according to claim 18, wherein the first and second capacitors satisfy a following formula (C):

$$Cs = \frac{Cz}{4}, \quad \text{(C)}$$

where the Cs is capacitances of the first and second capacitors, and the Cz is stray capacitances of the first and second surge absorption sections.

* * * * *